United States Patent
McCollum

(10) Patent No.: US 11,068,341 B2
(45) Date of Patent: Jul. 20, 2021

(54) ERROR TOLERANT MEMORY ARRAY AND METHOD FOR PERFORMING ERROR CORRECTION IN A MEMORY ARRAY

(71) Applicant: Microchip Technology Inc., Chandler, AZ (US)

(72) Inventor: John L. McCollum, Orem, UT (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/588,916

(22) Filed: Sep. 30, 2019

(65) Prior Publication Data
US 2021/0073072 A1    Mar. 11, 2021

Related U.S. Application Data

(60) Provisional application No. 62/896,297, filed on Sep. 5, 2019.

(51) Int. Cl.
*G06F 11/10* (2006.01)
*G11C 16/10* (2006.01)
*G11C 16/08* (2006.01)
*G11C 16/26* (2006.01)

(52) U.S. Cl.
CPC .......... *G06F 11/1068* (2013.01); *G11C 16/08* (2013.01); *G11C 16/10* (2013.01); *G11C 16/26* (2013.01)

(58) Field of Classification Search
CPC .................................................. G06F 11/1068
See application file for complete search history.

(56) References Cited

U.S. PATENT DOCUMENTS

| 3,588,830 | A | * | 6/1971 | Duda ............... | G11C 29/70 714/6.1 |
| 3,748,653 | A | * | 7/1973 | Debruyne ......... | G11C 17/08 365/200 |
| 4,592,024 | A |   | 5/1986 | Sakai et al. | |
| 4,654,847 | A | * | 3/1987 | Dutton ............ | G11C 29/70 714/6.1 |

(Continued)

FOREIGN PATENT DOCUMENTS

EP     0482928 A3    10/1993

OTHER PUBLICATIONS

International Search Report and Written Opinion, PCT/US2019/060500, dated Jun. 15, 2020.

*Primary Examiner* — Joseph D Torres
(74) *Attorney, Agent, or Firm* — Glass and Associates; Kenneth D'Alessandro; Kenneth Glass

(57) ABSTRACT

A method for providing error correction for a memory array includes for each memory word stored in a data memory portion of the memory array having at least one bit error, storing in an error PROM error data identifying a memory address for the data word in the data memory portion, a bit position of each bit error, and correct bit data for each bit error, monitoring memory addresses presented to the data PROM, if a memory address presented to the data memory portion is an identified memory address, reading from the error PROM the bit position of each bit error and the correct bit data for each bit error, and substituting the correct bit data into each identified bit position of a sense amplifier reading data from the data memory portion.

14 Claims, 10 Drawing Sheets

(56) References Cited

U.S. PATENT DOCUMENTS

| | | | |
|---|---|---|---|
| 5,056,089 A * | 10/1991 | Furuta | G06F 11/1008 714/703 |
| 5,930,183 A | 7/1999 | Kojima et al. | |
| 5,949,703 A | 9/1999 | Shibata et al. | |
| 2003/0058930 A1 * | 3/2003 | Sawada | G11B 20/10046 375/233 |
| 2008/0263385 A1 | 10/2008 | Dudeck et al. | |
| 2014/0369137 A1 | 12/2014 | Lee et al. | |

* cited by examiner

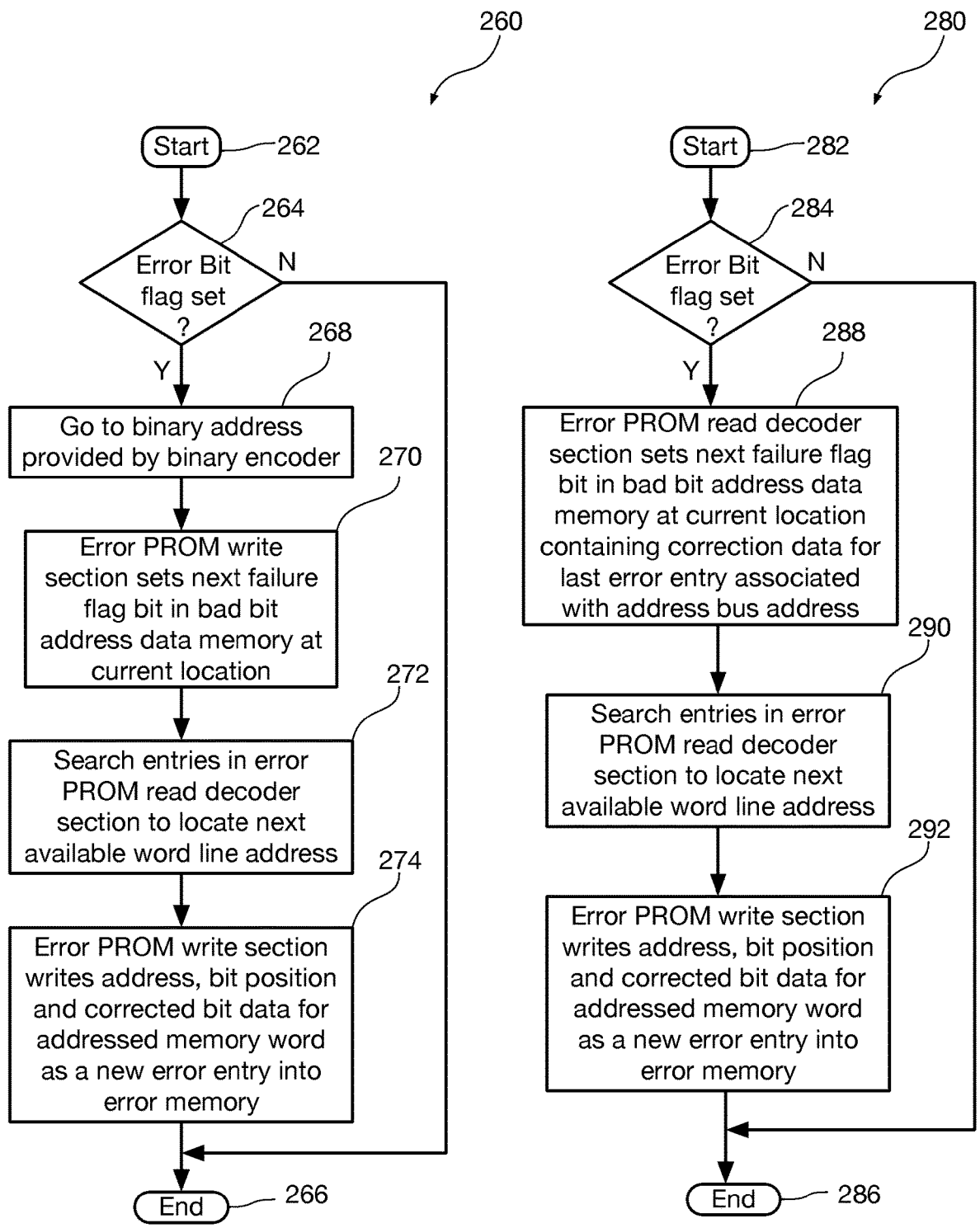

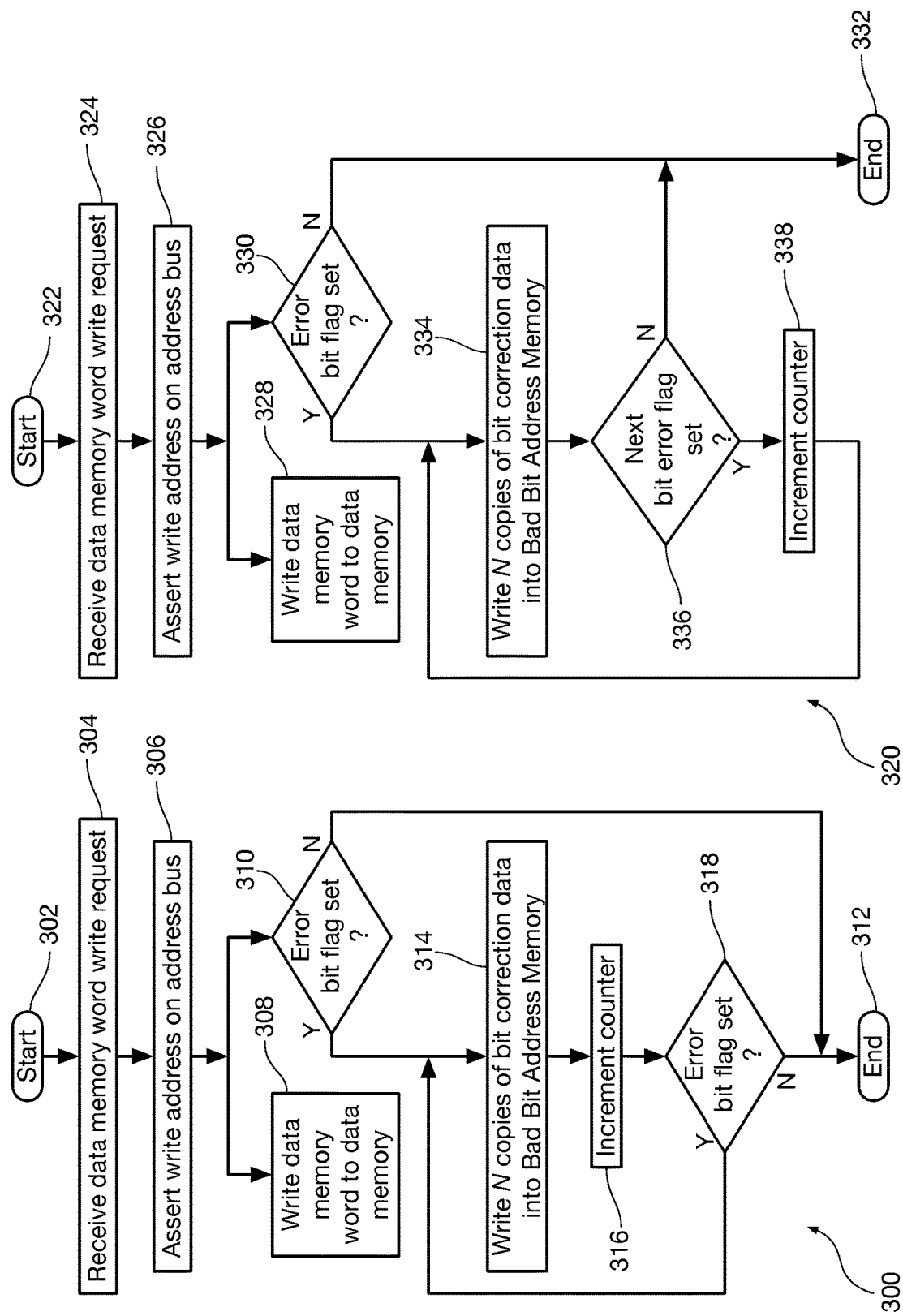

ERROR TOLERANT MEMORY ARRAY AND METHOD FOR PERFORMING ERROR CORRECTION IN A MEMORY ARRAY

CLAIM FOR PRIORITY

This application claims priority from Provisional U.S. Patent Application Ser. No. 62/896,297, filed on Sep. 5, 2019, the contents of which are incorporated by reference herein in their entirety

FIELD OF THE INVENTION

The present invention relates to programmable memory arrays. More particularly, the present invention relates to error-tolerant programmable memory arrays.

BACKGROUND

Small geometries now limit the maximum voltage applied to metal. Metal line size cannot shrink unless the applied voltage also shrinks. This fact will eventually eliminate electron storage as a viable technique. In fact, a manufacturer of leading-edge magnetic pole storage technology has concluded that this technology will not scale below 28 nm.

It appears that future non-volatile memories (NVMs) will employ programming and erase mechanisms that are based on material structure change, e.g. phase change memory (PCM) or resistive random-access-memory (ReRAM). Such material structural change relies on moving atoms through a solid material.

Because this program and erase mechanism introduces fatigue and wear-out in the solid material, the defect generation rate will likely increase by orders of magnitude. Memory designers must plan to deal with the increased defect generation rate.

Enterprise mass storage of data already deals with error correction. However, the solutions employed take advantage of large volumes of spare memory and milli-second time frames.

Integrated circuit memory has limited area and time frames of only microseconds to perform error correction, which error correction therefore needs to be fast and must efficiently utilize memory in order to enable manufacturing NVMs with a low failure rate at low cost.

BRIEF DESCRIPTION

In accordance with an aspect of the invention, a method for providing error correction for a memory array includes for each data word stored in a user memory portion of the memory array having at least one bit error, storing in an error PROM an error entry associated with an address of the data word in the data memory portion and including error data identifying a bit position of each bit error, and correct bit data for each bit error, monitoring memory addresses presented to the user memory portion, if a memory address presented to the user memory portion is the address of the data word in the data memory portion, reading from the error PROM the bit position of each bit error and the correct bit data for each bit error, and substituting the correct bit data into each identified bit position of a memory read circuit arranged to read data from the user memory portion.

In accordance with an aspect of the invention, storing in the error PROM the error entry including the bit position of each bit error, and the correct bit data for each bit error includes programming a unique term into a programmable logic device that is a Boolean combination of the address of the data word in the user memory portion and the number of the bit error.

In accordance with an aspect of the invention, the number of the bit error is defined by an output state of a counter which forms a portion of the unique term that is the Boolean combination.

In accordance with an aspect of the invention, each bit error in the data word is accessed in sequence by incrementing the counter to provide a different unique term, and the counter is incremented until the unique term that is a Boolean combination of the memory address of the data word and the output state of the counter does not define an error entry.

In accordance with an aspect of the invention, each error entry for a bit error at a memory address includes a next failure flag bit, the next failure flag bit for the most recently stored error entry for the memory address is in a first state and the next failure flag bit for all other stored error entries for the memory address is in a second state opposite the first state, and the counter does not further increment when its output state is associated with a unique term defining the number of the last entered bit error.

In accordance with an aspect of the invention, reading from the error PROM the bit position of each bit error includes reading the bit position of each bit error from a memory in the error PROM, and reading from the memory in the error PROM the correct bit data for each bit error includes reading the correct bit data for each bit error from the memory in the error PROM.

In accordance with an aspect of the invention, reading from the error PROM the correct bit data for each bit error includes reading multiple copies of the correct bit data for each bit error from the memory in the error PROM, and determining a correct data value from the read multiple copies of the correct bit data.

In accordance with an aspect of the invention, a method for providing error correction for a memory array includes, supplying to the memory array a memory address identifying a data word to be read from the memory array, simultaneously supplying the memory address to an error PROM containing only data representing memory addresses identifying a data word of the memory array having defective data in at least one bit position, if the memory address supplied to the error PROM identifies the data word having defective data in the at least one bit position, outputting from the error PROM corrected data and information identifying the bit position of the defective data in the data word, reading the data word from the memory array into a memory read circuit, and substituting the corrected data from the error PROM into the identified bit position of the memory read circuit.

In accordance with an aspect of the invention, outputting from the error PROM corrected data includes outputting N copies of the corrected data, and selecting from the N copies of the corrected data a single corrected data bit.

In accordance with an aspect of the invention, a memory array with error correction includes a user memory portion containing memory data words, a sense amplifier section coupled to the user memory portion, an address bus coupled to the user memory portion, an error PROM coupled to the address bus, user memory portion error correction code (ECC) section operatively coupled to the user memory portion, a controller coupled to the address bus, the controller configured to assert an address on the address bus to read a data word from the user memory portion into the sense amplifier section, write a user memory portion error entry into the error PROM in response to a signal from the user memory portion memory error correction code (ECC) section, the user memory portion error entry identifying a data word stored in the user memory portion having at least data bit error, the bit position in the word of the data bit error, and a corrected data value for the data bit error. The error PROM is responsive to addresses asserted on the address bus having error entries to read the correct data value for the data bit error and generate a correction signal to the sense amplifier section to substitute the read correct data value for the data bit error at the identified bit position in the data word at the address having error entries.

In accordance with an aspect of the invention, the memory array with error correction further includes an error PROM error correction code (ECC) section operatively coupled to the error PROM, and the controller is further configured to respond to a signal from the error PROM error correction code (ECC) section, the signal from the error PROM error correction code (ECC) section identifying a data error entry stored in the error PROM memory having at least one error, the response including writing a corrected PROM data error entry into the error PROM memory and disabling the identified user memory portion error entry stored in the error PROM memory.

In accordance with an aspect of the invention, disabling the identified user memory portion error entry stored in the error PROM memory includes programming an additional bit at the data entry error address.

In accordance with an aspect of the invention, the substitution of the read correct data value for the data bit error at the identified bit position in the data word includes overwriting defective data initially written into the sense amplifier at the identified bit position in the data word.

In accordance with an aspect of the invention, the substitution of the read correct data value for the data bit error at the identified bit position in the data word includes substituting the read correct data for defective data read from the user memory portion.

In accordance with an aspect of the invention, the controller is further configured to increment a counter to locate multiple error entries for storing correct data values for multiple bit errors in a single data word stored in the user memory portion.

In accordance with an aspect of the invention, the controller is further configured to stop incrementing the counter when the counter is incremented to a count state that does not locate an error entry in the error PROM memory.

In accordance with an aspect of the invention, the counter reaches a state that locates the last entered error entry for the data word in the error PROM memory.

BRIEF DESCRIPTION OF THE DRAWING FIGURES

The invention will be explained in more detail in the following with reference to embodiments and to the drawing in which are shown:

FIG. 8 is a flow diagram illustrating an example of a method for setting a next failure flag in a location in a bad bit address data memory of an error PROM in accordance with an aspect of the invention;

FIG. 9 is a flow diagram illustrating another example of a method for setting a next failure flag in a location in a bad bit address data memory of an error PROM in accordance with an aspect of the invention; and FIG. 10A, FIG. 10B, FIG. 11A and FIG. 11B are flow diagrams that show illustrative methods for writing new data to a selected memory address in the memory array in accordance with an aspect of the invention.

DETAILED DESCRIPTION

Persons of ordinary skill in the art will realize that the following description is illustrative only and not in any way limiting. Other embodiments will readily suggest themselves to such skilled persons.

Figure 1:
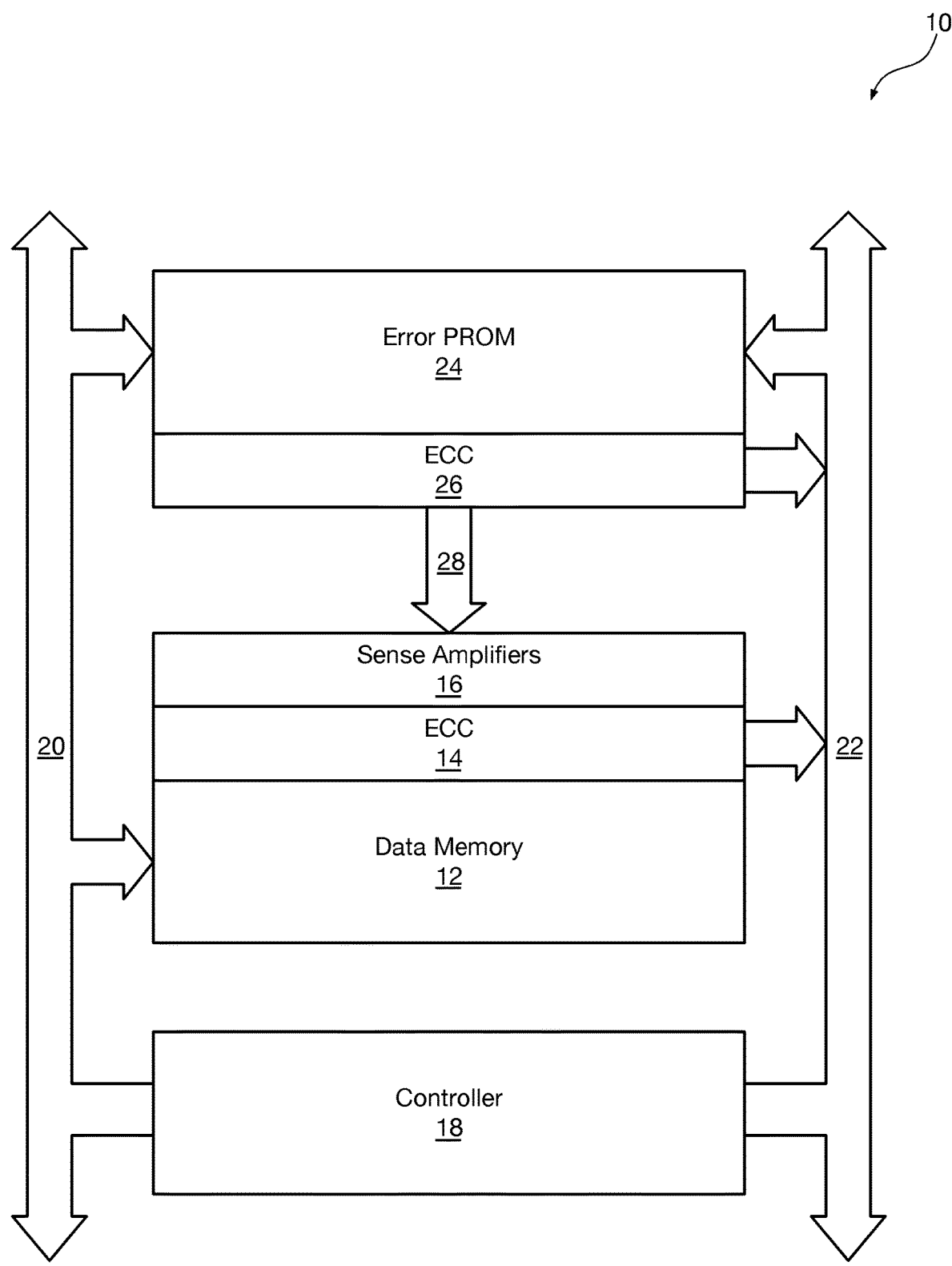
FIG. 1 is a block diagram showing an illustrative memory array with error correction in accordance with an aspect of the present invention.

Referring first of all to FIG. 1, a block diagram shows an illustrative memory array 10 with error correction in accordance with an aspect of the present invention. Data is stored in a user memory portion 12 of the memory array 10. An error correction section (ECC) 14 performs error correction on data read from the user memory portion 12 before presenting it to sense amplifiers 16. Memory operations are controlled by a controller 18 over an address bus 20. The address bus 20 also includes control lines for reading and writing operations (not explicitly shown). The ECC section 14 communicates with the controller 18 over bus 22.

In accordance with an aspect of the present invention an error programmable read only memory (PROM) 24 is provided that also communicates with the controller 18 to receive addresses across address bus 20. An error correction section (ECC) 26 associated with error PROM 24 performs error correction on data read from the error PROM 24 before presenting it across a bus 28 to the sense amplifiers 16. As will be described further below, the output from the error PROM 24 corrects bit errors in user data presented from the user memory portion 12 to the sense amplifiers 16 by substituting corrected bit values before the sense amplifiers 16 output the addressed data from the user memory portion 12. Persons of ordinary skill in the art will appreciate that the sense amplifiers 16 could also be latches into which the user data from the user memory portion 12 is transferred after being sensed.

Figure 2:
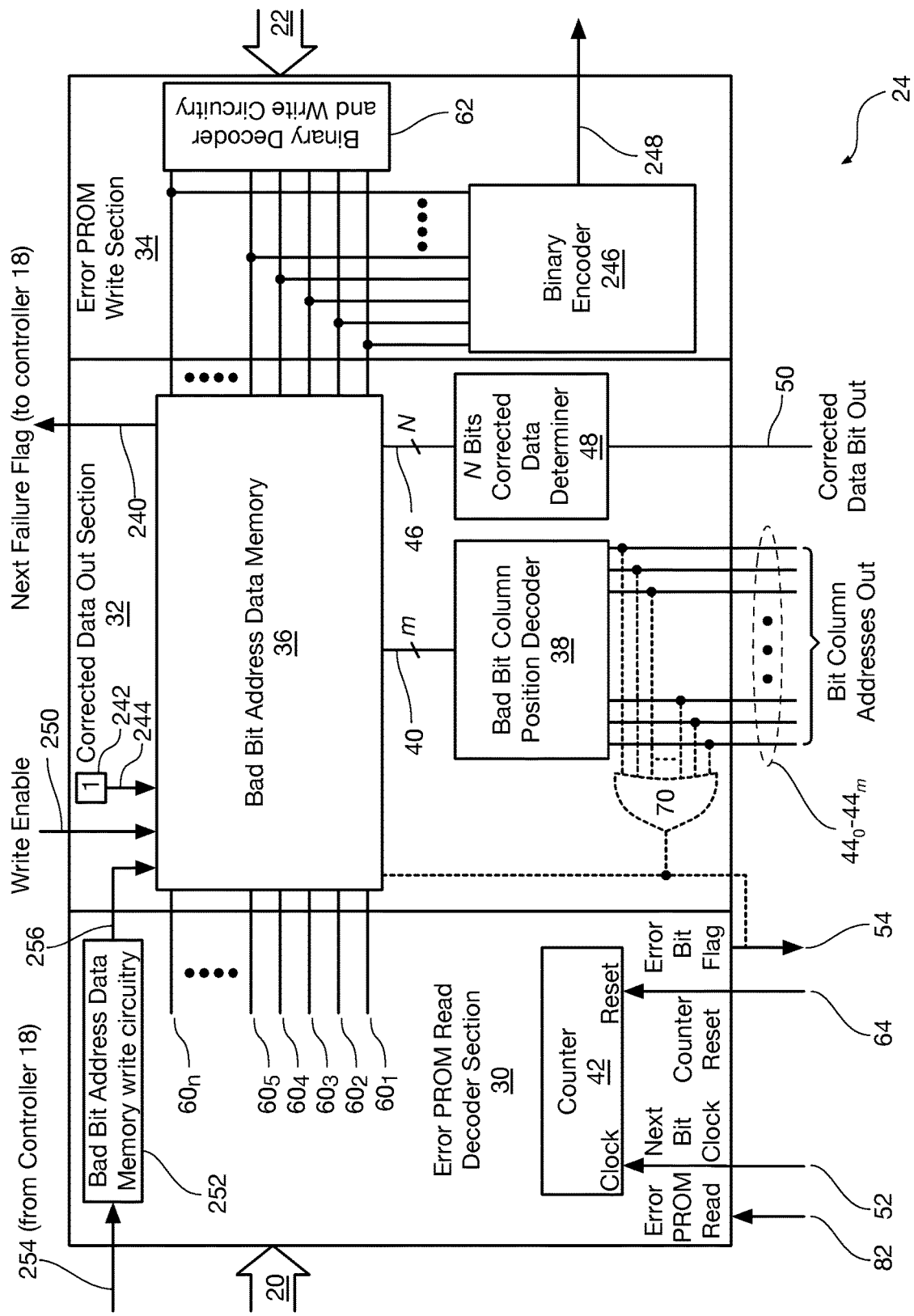
FIG. 2 is a block diagram showing an illustrative configuration for an error correction PROM in accordance with an aspect of the present invention.

Referring now to FIG. 2, a block diagram shows an illustrative configuration for the error PROM 24 of FIG. 1 in accordance with an aspect of the present invention. In the embodiment shown in FIG. 2, the error PROM 24 includes an error PROM read decoder section 30, a corrected data out section 32, and an error PROM write section 34.

The error PROM read decoder section 30 functions as a programmable decoder and is simultaneously provided, on address bus 20, with the same address provided to the user memory portion 12 of the memory array 10 when data is to be read from the user memory portion 12 and further comprises a counter 42 as will be disclosed herein. Each individual bit error that has been identified is programmably decoded as an error entry that is a combination of an address on address bus 20 and the contents of the counter. As will be disclosed herein, use of the counter allows multiple bit errors in a single word to each be programmed as an individual bit error.

For each individual identified bit error, a bad bit address data memory 36 of corrected data out section 32 of the error PROM 24 stores data identifying both the bit column position of the error and the correct data to replace the erroneous bit values. Operation of the error PROM read decoder section 30 will be discussed in detail with reference to FIG. 3.

Figure 3:
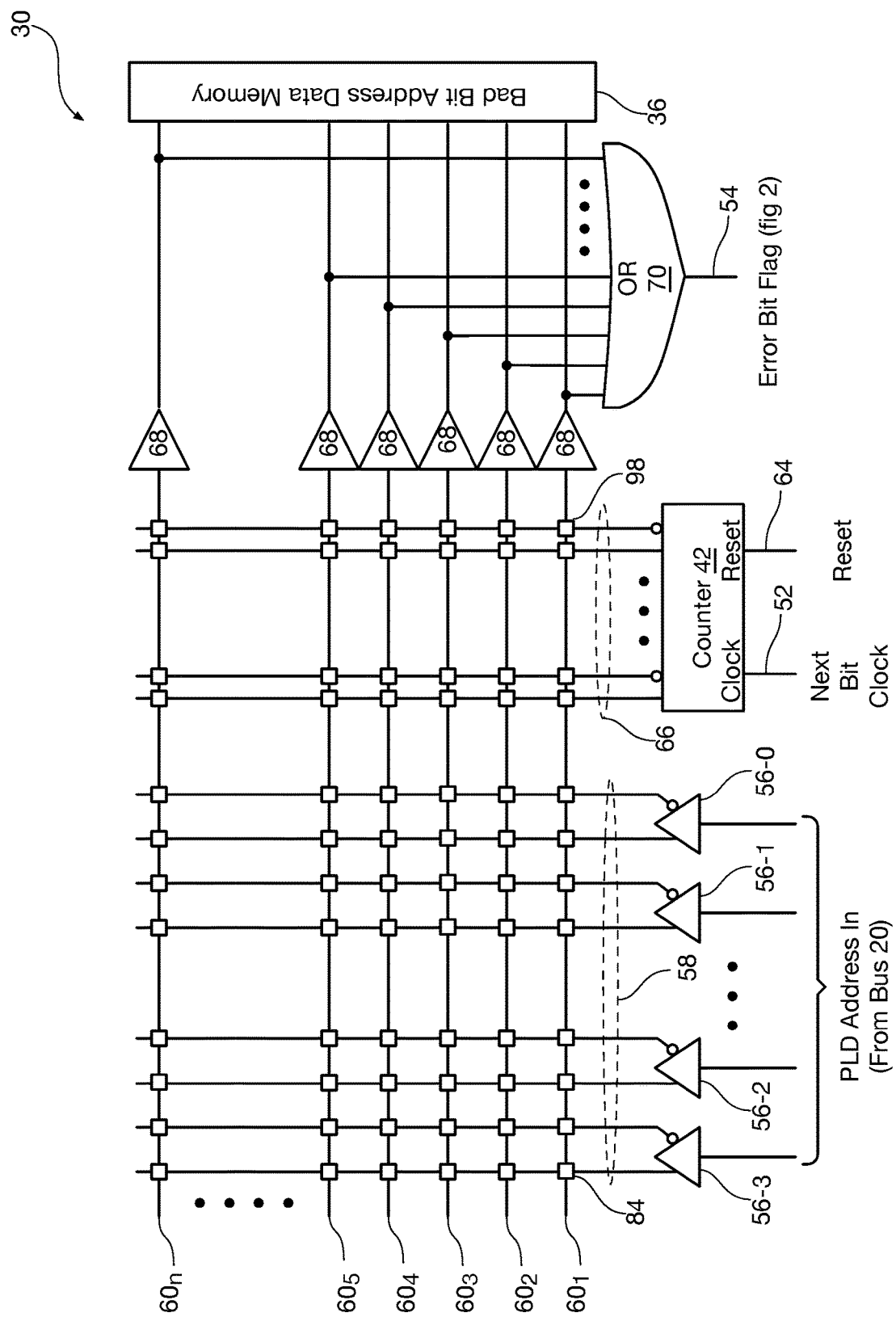
FIG. 3 is a diagram showing an illustrative configuration for an error PROM read decoder section of an error correction PROM in accordance with an aspect of the present invention.

The programmable decoder of the error PROM read decoder section 30 is programmed to respond to a combination of the address on address bus 20 and the state of a counter 42 shown in FIG. 3. If the combination does not correspond to an error entry programmed into error PROM read decoder section 30, the error PROM 24 takes no action. If the combination of the address on address bus 20 and the state of the counter 42 corresponds to an error entry programmed into error PROM read decoder section 30, the error PROM read decoder section 30 asserts the error bit flag on line 54 which is fed to controller 18 via bus 22 (connection not shown). The error bit flag signal on line 54 may be sourced in several different ways, examples of which will be disclosed herein.

Each location in the bad bit address data memory 36 represents an error entry and is programmed with data including the bit position of the error in a word read from the data memory 12 and corrected data to substitute for the bad data. The locations in the data memory are preferably programmed in the order in which the errors are encountered.

Bad bit address data memory 36 in the corrected data out section 32 drives a bad bit column position decoder 38 and a corrected data determiner 48. If the combination of the address on address bus 20 and the state of the counter 42 corresponds to an error entry in bad bit address data memory 36 the output from the bad bit column position decoder 38 identifies the bit position in the data word of the bit at the address to be corrected and the corrected data determiner 48 outputs the correct data.

The bad bit column position decoder 38 is a one-of-m decoder. It receives an m-bit output on lines 40 from the bad bit address data memory 36 that identifies the column location of the particular bit having the erroneous bit value and decodes it to one of lines $44_0$ through $44_n$ corresponding to the column location of the particular bit having the erroneous value. This signal on the one of lines $44_0$ through $44_n$ of the bad bit column position decoder 38 is used to generate a decoded write error data strobe in the sense amplifiers as will be discussed with reference to FIG. 5. The bad bit address data memory 36 stores N distinct copies of the correct value for the defective bit where N 1, and outputs them on lines 46. The number of copies N can be selected to provide a desired level of redundancy given the fact that the replacement bits are stored using the same storage mechanism that is used for the memory cells in the user memory portion 12 and is thus subject to the same defect mechanisms as the cells of the user memory portion 12. Use of N copies of the correct data value allows for voting schemes to be employed as is known in the art in order to allow for correction even if one or more of the stored corrected data values stored in bad bit address data memory 36 become defective. In an exemplary embodiment, a corrected data determiner 48 receives the N copies of the correct data value output on lines 46 and utilizes a voting scheme to determine the correct data value, and outputs the correct data value on corrected data bit out 50. The use of N copies of the correct data value and corrected data determiner 48 is not required, and in some embodiments bad bit address data memory 36 may output a single corrected value. Those skilled in the art will recognize that the use of bad bit column position decoder 38 saves storage space in bad bit address data memory 36, however in other embodiments the decoded actual bit position is stored within bad bit address data memory 36, which outputs lines $44_0$ through $44_n$. Bad bit address data memory 36 need not store N identical copies of the correct data value. In one embodiment the correct data value is stored in certain predetermined cells and the complement of the correct data value is stored other predetermined cells.

Reference numeral 52 identifies a next bit clock, the operation of which will be described herein. The next bit clock 52 is used to increment the counter 42 to provide the partial address that identifies the positions of one or more defective bits in a word at a memory address on address bus 20 that has been identified as having one or more defective bits. The use of the counter 42 allows separate entries to be programmed into the error PROM read decoder section 30 for each bit error of a data word stored at a single address on address bus 20. Each entry in error PROM read decoder section 30 addresses a unique address line in bad bit address data memory 36. Reference numeral 54 identifies an output that signals the decoding of an error entry associated with a defective bit. These inputs and outputs will be discussed with reference to FIG. 3.

The error PROM write section 34 receives instructions and data from the controller 18 of FIG. 1 over bus 22. The controller 18 communicates with the ECC section 14 that performs error correction on data read from the user memory portion 12. Bit errors that are identified by the ECC section 14 are communicated to the controller 18. The controller 18 then transmits to the error PROM write section 34 the location of the identified bit error, including its memory address, bit column location within the memory word at that address, and the correct value for the defective bit. As has been explained above, multiple copies of the correct value for the bit are preferably stored to provide error correction for the correct values for the defective bit. Error PROM write section 34 programs an error entry into error PROM read decoder section 30 (connection not shown). The error entry includes the address on address bus 20 containing the error and a bit count indicator (the count state output of counter 42) to indicate the present bit error number. Error PROM write section 34 further programs an m-bit data entry that identifies the column location of the particular bit having the erroneous bit value and N copies of the correct value for the bit into the bad bit address data memory 36 into the associated address line decoded by error PROM read decoder section 30.

Once the bit position and correct bit data have been programmed into the bad bit address data memory 36 in the corrected data out section 32 and the address and bit count indicator into error PROM decoder section 30, the error is corrected by error PROM 24 the next time that the error entry is decoded in the error PROM read decoder section 30.

Addressing of the bad bit address data memory 36 in the corrected data out section 32 of the error correction PROM 24 will be discussed with reference to FIG. 3. The bad bit column position decoder 38 supplies the column location of the bit being corrected and the bad bit address data memory 36 supplies the correct data value to replace in the designated bit position in the sense amplifiers 16. As will be disclosed herein, use of the counter 42 allows each individual failed bit in a word read from the user memory portion 12 to be identified as a separate error entry and corrected using a substitute bit provided from the error PROM 24.

The memory array 10 with error correction of the present invention also monitors the output of the error PROM 24 and corrects errors that are generated by defective storage locations in the error PROM read decoder section 30 in the error PROM 24. The ECC 26 associated with the error PROM 24 shown in FIG. 1 monitors the m-bit data on lines 40 and the N bits of corrected data on lines 46 from the bad bit address data memory 36, and optional ECC information that may be stored in bad bit address data memory 36 along with the m-bit data on lines 40 and the N bits of corrected data. The ECC 26 associated with the error PROM 24 communicates with the controller 18 of FIG. 1 if an error is detected. Errors that are identified by the ECC section 26, and corrected thereby, are communicated to the controller 18. The controller 18 then directs the error PROM write section 34 to disable the error entry that returned the erroneous data and to substitute another address in the bad bit address data memory 36 for the address that returned the data having an error, and provides the corrected data bits recovered by ECC section 26 to be stored in the bad bit address data memory 36 associated with the newly-substituted address. Error PROM read decoder section 30 is further reprogrammed by error PROM write section 34, responsive to controller 18, to point to the newly-substituted address.

The memory array 10 with error correction operates by reading a data word from the user memory portion 12, and holding it in the sense amplifiers 16. Simultaneously, correction data for known bit read errors stored in error PROM 24 for the word accessed in the user memory portion 12 is accessed and written into the sense amplifiers 16.

An ECC check is performed by ECC 14 on the data word in the sense amplifiers 16 containing, if applicable, the substituted corrected data bits from the error PROM 24. If (ECC) 14 identifies a new error, a new error entry is written into the error PROM read decoder section 30 in the error PROM 24, and the m-bit position data and the N copies of correct bit value generated by ECC 14 are written into the bad bit address data memory 36 by error PROM write section 34. Error PROM read decoder section 30 is further programmed by error PROM write section 34, responsive to controller 18, to point to the new error entry when the address appears on address bus 20, and the counter 42 points to the present error number at that address. If the ECC 26 associated with the error PROM 24 identifies an error, as previously noted the error address location and corrected data generated by ECC 26 is written into a new location in the error PROM read decoder section 30 in the error PROM 24 and the bad word line location in in the error PROM 24 is disabled by reprogramming the error PROM read decoder section 30 to point to the new location in the error PROM read decoder section 30 when the address and counter have reached the present state as will be disclosed herein. This will prevent the word line with the identified error from ever being selected. In some embodiments ReRAM element 78 is erased to prevent the word line with the identified error from ever being selected.

Referring now to FIG. 3, a diagram shows an illustrative configuration for an error PROM read decoder section 30 of an error PROM 24 like that of FIG. 2 in accordance with an aspect of the present invention. The particular solution shown in FIG. 3 is implemented using a programmable decoder such as a PLD-like addressing architecture, it being understood that other addressing architectures may be used without exceeding the scope.

The address bus 20 used to provide memory addresses to the user memory portion 12 is also used to provide addresses to the error PROM read decoder section 30, which determines if any errors have been previously identified in the data contained at the address on address bus 20. Individual address bits from the address bus 20 are provided to buffers 56-0, 56-1, 56-2, and 56-3. Persons of ordinary skill in the art will appreciate that while four address bits are shown in FIG. 3, they number of address bit used will be equal to the number of address bits provided on address bus 20.

Buffers 56-0, 56-1, 56-2, and 56-3 each have complementary inverting and non-inverting outputs shown collectively at reference numeral 58. A plurality of lines $60_1$ through $60_n$ are shown intersecting the complementary inverting and non-inverting output lines 58 of the buffers 56-0, 56-1, 56-2, and 56-3 and serve as output terms for Boolean logic implemented in the error PROM read decoder section 30. Each of the lines $60_1$ through $60_n$ can be programmed to represent an address and an error number at the represented address at which a data error has been found as will be disclosed herein. Persons of ordinary skill in the art will appreciate that the number of lines n is a number representing a maximum number of different addresses having defective data bits that the designer specifies can be corrected. In larger memory arrays 10, the number n can be in the thousands.

In accordance with one aspect of the present invention, the addresses of memory cells in the user memory portion 12 having failed bits is efficiently written into the error PROM read decoder section 30 of the error PROM 24 in the order of the occurrence of the failures using binary addresses that are mask programmed to correspond to one of the of the lines $60_1$ through $60_n$, with address 0 corresponding to line $60_1$, and incrementing for each new entry. The mask programmed addresses are provided by a binary decoder and write circuitry 62 in the error PROM write section 34. Persons of ordinary skill in the art will recognize that the binary decoder in the binary decoder and write circuitry 62 is organized as a binary-to-one-of-n-line decoder well known to those of ordinary skill in the art where $2^{(n-1)}$ binary inputs (provided from bus 22) are decoded to activate one of n output lines (shown in FIGS. 2 and 3 as lines $60_1$ through $60_n$. The write circuitry in the binary decoder and write circuitry 62 may be any circuitry for programming the nonvolatile memory elements in the error PROM 24, represented as ReRAM elements in the illustrative embodiments disclosed herein. Details and operation of such programming circuitry are well known to those of ordinary skill in the art and will not be discussed herein in order to avoid overcomplicating the disclosure and obscuring the details of the present invention.

The counter 42 has a next bit clock input 52 (previously identified with reference to FIG. 2), a reset input 64, and a set of complementary outputs identified collectively at reference numeral 66. Each counter state represents an error number at the address and is decoded to represent an error bit position in a data word stored in the user memory portion 12 by bad bit address data memory 36. As an example, in a memory organized as 32-bit words, counter 42 will be a 5-bit counter whose complementary outputs are decoded to a one-of-32 selection as is known in the art. The counter state does not represent the actual bit location in the word, but rather whether this is the $1^{st}$, $2^{nd}$ or $n^{th}$ bit error being corrected at that address, i.e. each bit error is identified by error number in the order in which the error has been detected. Logical connections are programmed between the complementary outputs 66 of the counter 42 and the lines $60_1$ through $60_n$ to allow each of the lines $60_1$ through $60_n$ to represent a bit error number of defective data at that address. The counter 42 is reset on line 64 each time a new address is asserted on the address bus 20. The lines $60_1$ through $60_n$ can be individually programmed so that each line uniquely decodes an error identified by an address on address bus 20 and a count state of counter 42 thus allowing more than one bit error to be corrected in a data word read from the data memory 12 as will be disclosed herein.

Each of the lines $60_1$ through $60_n$ is shown buffered by a buffer 68 and presented as address lines to the bad address data memory 36. Since, when programmed as disclosed herein, each of lines $60_1$ through $60_n$ respond to a single bit error defined by a unique combination of an address on address bus 20 and a count state of counter 42, only one of lines $60_1$ through $60_n$ will respond to any combination of an address on address bus 20 and state of counter 24 previously identified as an individual bit error, the outputs of buffers 68 thus form decoded word line addresses to the bad bit address data memory 36.

When an address presented on address bus 20 includes one or more bit errors, an error bit flag 54 indicates the existence of the error. There are several ways to implement the bit flag 54. In one embodiment of the invention shown in FIG. 3, the buffered lines $60_1$ through $60_n$ are presented to OR gate 70. The output of OR gate 70 at line 54 (previously identified with reference to FIG. 2) indicates whether or not there are any known defective bits presented on the one of lines 60-X that have uniquely decoded a combination of the address on the address bus 20 and the counter state of the counter 42.

In another embodiment of the invention, shown in FIG. 2, the OR gate 70 is shown in dashed lines and may have its inputs driven by the bit column address lines $44_0$ through $44_m$. In this configuration, the output of the OR gate 70 will only go to a high logic level when one of the bit column address lines $44_0$ through $44_m$ goes high to indicate the bit position of an error programmed into the bad bit address data memory 36. In this embodiment of the invention, the OR gate 70 only requires m inputs corresponding to the number of bit column address lines output from the bad bit column position decoder rather than a number of inputs equal to the number of the word lines $60_1$ through $60_n$ in the error PROM read decoder section 30 of the error PROM 24. In embodiments of the invention that provide for correction of a large number of individual bit errors, the number of inputs to the OR gate 70 depicted in FIG. 3 will also become large and locating the OR gate 70 as shown in FIG. 2 will save die area and wiring area on the integrated circuit.

In another embodiment of the invention, also shown in FIG. 2, a column in the bad bit address data memory 36 is used as the error bit flag and is programmed to a logic high state, producing a high logic level on the dashed line output of the bad bit address data memory 36 (which becomes error bit flag 54) when any address is selected by lines 60-through 60-5. This scheme eliminates the OR gate 70 entirely, saving die space on the integrated circuit.

Figure 4:
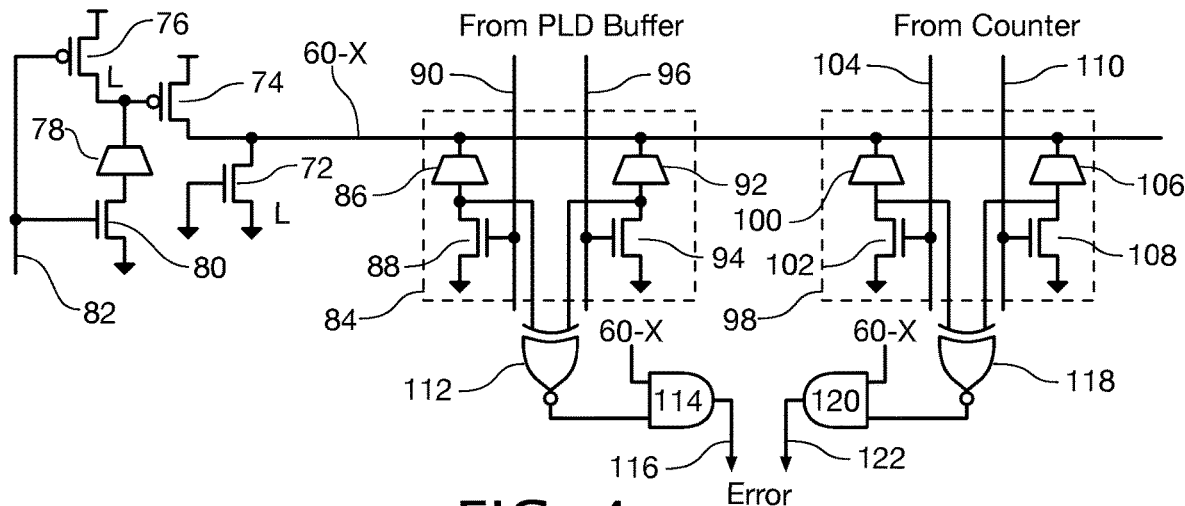
FIG. 4 is a diagram showing an illustrative circuit that may be used for biasing and programming the error PROM read decoder section of FIG. 3.

In accordance with an aspect of the present invention, before any defective addresses found in the user memory portion 12 have been programmed into the error PROM read decoder section 30, all of the lines $60_1$ through $60_n$ are weakly held to a logic low level. Referring now to FIG. 4, a diagram shows an illustrative circuit that may be used for biasing the lines $60_1$ through $60_n$ and for programming the error PROM read decoder section 30 of FIG. 3.

FIG. 4 shows a representative line 60-X. Prior to any information being programmed into error PROM read decoder section 30, n-channel transistor 72 which has a voltage threshold lower than the other transistors connected to line 60-X exhibits subthreshold leakage current to hold line 60-X at a low logic level. P-channel transistor 74 is connected to line 60-X as a pullup device. P-channel transistor 76 is connected in series with ReRAM element 78 and n-channel transistor 80. The gates of p-channel transistor 76 and n-channel transistor 80 are connected together. Initially, the ReRAM element 78 is unprogrammed (erased) and remains in a high-resistance state. P-channel transistor 76 has a voltage threshold that is low enough to exhibit enough subthreshold leakage current to pull the gate of p-channel transistor 74 up to $V_{DD}$ to maintain it in an off state. The common gate connection of p-channel transistor 76 and n-channel transistor 80 is connected to an error PROM read line 82 (also shown in FIG. 2), which is maintained at a low logic state and asserted by the controller 18 to read the error PROM read decoder section 30. N-channel transistor 80 is in an off state and p-channel transistor 76 is turned on. Because the ReRAM element 78 is unprogrammed, raising the voltage at error PROM read line 82 to turn on the n-channel transistor 80 to read the memory 30 has no effect on the circuit, since the subthreshold leakage of p-channel transistor 76 provides a greater amount of current that can be supplied through the unprogrammed ReRAM element 78.

Referring again to FIG. 3, prior to any information being programmed into error PROM read decoder section 30, all of lines 60-1 through 60-5 are held low by transistors 74, 76, and 80 as previously described. The inputs to OR gate 70 buffered through buffers 68 are all at logic low states and the output at line 54 of the OR gate 70 is at a low logic state.

When it desired to associate line 60-X with a memory address at which a defective bit has been identified, error PROM write section 34 programs the ReRAM element 78 that is coupled to the line 60-X through the circuitry described with reference to FIG. 4 and also programs a combination of the ReRAM elements within programming circuits 84 and 98, i.e. ReRAM elements 86, 92, 100 and 106, that will respectively uniquely allow line 60-X in response to an address on address bus 20 in combination with the next available count state of counter 42 (starting at count state 0 for the first error) to be pulled high. After the ReRAM element 78 and the combination of the programming circuits 84 and 98 have been programmed, whenever error PROM read line 82 is brought to a high logic level by asserting a signal from the controller 18 on error PROM read line 82 to read the error PROM read decoder section 30, n-channel transistor 80 is turned on, and pulls the gate of p-channel transistor 74 down to a low logic level because of the low resistance path through ReRAM element 78. This turns on p-channel transistor 74 which overcomes the weak leakage of n-channel transistor 72 that had kept line 60-X at a low logic state, and allows line 60-X to be pulled up to a high logic state when it is addressed by a combination of a partial address supplied by an address on address bus 20 and a partial address supplied by the state of the counter 42 that together provide an address to the bad bit address data memory 36 whose output identifies the bit position in the addressed data word of the bad bit and the correct data value for the bad bit.

When the address from address bus 20 that has been programmed into the line 60-X to identify a bad bit is presented to the error PROM read decoder section 30 on address bus 20, and the counter 42 is at the count state identifying the bad bit error number, only the combination of turned-on n-channel transistors (88, 94) (102, 108) and their respective series connected ReRAM elements (86, 92) (100, 106) on line 60-X provides no circuit path to pull the line 60-X down to ground because none of the ReRAM elements (86, 92) (100, 106) in the particular combination have been programmed. Because the one of the inputs to OR gate 70 from line 60-X is now high due to programmed ReRAM element 78 and the unique combination of programming circuits 84 and 98, its output at line 54 (the error bit flag) changes to a high logic level. All other address and counter state combinations will have at least one combination of a turned-on n-channel transistor (88, 94), (100, 106) and its respective series connected ReRAM element (86, 92), (100, 106) that provides a circuit path to pull the line 60-X down to ground.

When the memory address at which a defective bit has been identified by ECC 14, responsive to controller 18 error PROM write section 34 programs that address into the next available one of lines $60_1$ through $60_n$. The correct bit is written into the respective location in bad bit address data memory 36 by binary decoder and write circuitry 62. As previously noted, prior to any addresses being programmed into the error PROM read decoder section 30, all of lines $60_1$ through $60_n$ are held weakly to a low logic state by leakage current through n-channel transistor 72.

The method of programming any line 60-X to respond to a memory address having a defective data bit can be seen by further examination of FIG. 3 and FIG. 4. Reference numeral 84 (identifying one of the small squares at each intersections of the lines $60_1$ through $60_n$ and the complementary outputs 58 of the buffers 56-0 through 56-3 in FIG. 3 and the circuitry within the dashed lines 84 of FIG. 4) represents a programmable circuit that is used to program an address into any one of lines $60_1$ through $60_n$. In FIG. 4, the circuitry 84 can be seen to include first ReRAM element 86 in series with an n-channel transistor 88 between the line 60-X and ground. The gate of the n-channel transistor 88 is connected to the non-inverting output 90 of one of the buffers 56-0 through 56-3 in FIG. 3. Second ReRAM element 92 is in series with an n-channel transistor 94 between the line 60-X and ground. The gate of the n-channel transistor 94 is connected to the inverting output 96 of the one of the buffers 56-0 through 56-3 in FIG. 3. When a logic high level is presented on output lines 90 or 96 of the buffers 56-0 through 56-3, the one of the transistors 88 and 94 coupled to that line will be turned on. If the ReRAM device in series with that transistor has been programmed to its low-resistance state, the line 60-X will be pulled down to ground overcoming pull-up p-channel transistor 74.

To program an address into the error PROM read decoder section 30, the ReRAM elements in the programmable circuits 84 associated with all of the buffers 56-0 through 56-3 are selectively programmed in a unique pattern such that when the selected address is presented to the error PROM read decoder section 30 on address bus 20, only one combination of turned-on n-channel transistors (88, 94) and their respective series connected ReRAM elements (86, 92) provides no circuit path to pull the line 60-X down to ground because none of the ReRAM elements in the particular combination have been programmed. All other address combinations will have at least one combination of a turned-on n-channel transistor (88, 94) and its respective series connected ReRAM element (86, 92) that provides a circuit path to pull the line 60-X down to ground.

Persons of ordinary skill in the art will appreciate that conventional ReRAM programming circuitry and techniques may be employed to program the ReRAM elements (e.g., ReRAM elements 78, 84, and 98 depicted in FIG. 3 and FIG. 4). Specific circuitry in the error PROM write section 34 for applying the appropriate programming potentials to the various ReRAM elements is not shown to avoid overcomplicating the disclosure and obscuring the present invention.

After an address and bit error number as described below is programmed into the ReRAM elements in the programmable circuits 84 associated with all of the buffers 56-0 through 56-3 to present the unique pattern described above, the error PROM read decoder section 30 monitors the address bus 20.

The counter 42 allows multiple bad bits in a single data memory word to be corrected and is used to identify which bit error of the selected address programmed into the one of lines $60_1$ through $60_n$ is defective. The counter is reset each time an address is asserted on address bus 20 and thus starts at zero. The counter is incremented as shown in the flow chart of FIG. 6. In a non-limiting example of an embodiment of the present invention, a 5-bit counter will allow up to 32 bit errors in a single memory word to be decoded using 5 complementary-bit outputs as is known in the art.

The method of programming any one of 32 addresses to identify the bit error number in a word identified on one of lines $60_1$ through $60_n$ can be seen by further examination of FIG. 3 and FIG. 4. Reference numeral 98 (identifying one of the small squares at each intersections of the lines $60_1$ through $60_n$ and the complementary outputs 66 of the counter 42 in FIG. 3 and the circuitry within the dashed lines 98 of FIG. 4) represents a programmable circuit that is used to program one of the addresses, as a non-limiting example one of the 32 addresses, from the counter 42 into any of lines $60_1$ through $60_n$ to identify up to 32 defective bit error numbers in a word identified on one of lines $60_1$ through $60_n$. In FIG. 4, the circuitry 98 can be seen to include a first ReRAM element 100 in series with an n-channel transistor 102 between the line 60-X and ground. The gate of the n-channel transistor 102 is connected to the non-inverting output 104 of one of the complementary counter outputs 66 in FIG. 3. A second ReRAM element 106 is connected in series with an n-channel transistor 108 between the line 60-X and ground. The gate of the n-channel transistor 108 is connected to the inverting output 104 of one of the complementary counter outputs 66 in FIG. 3. When a logic high level is presented on lines 104 or 110, the one of the transistors 102 and 108 coupled to that line will be turned on. If the ReRAM device in series with that transistor has been programmed to its low-resistance state, the line 60-X will be pulled down to ground.

Thus, the bit error number is programmed into error PROM read decoder section 30, by selectively programming the ReRAM elements in the programmable circuits 98 associated with all of the outputs of counter 42 in a unique pattern such that when the bit error number is presented at the output of counter 42, only one combination of turned-on n-channel transistors (102, 108) and their respective series connected ReRAM elements (100, 106) provides no circuit path to pull the line 60-X down to ground. All other combinations of turned-on n-channel transistors (102, 108) and their respective series connected ReRAM elements (100, 106) provides at least one circuit path to pull the line 60-X down to ground.

When the address on bus 20 is presented to the error PROM 24, the counter 42 is in its zero state. If the address on bus 20 identifies a data word with one bit error, the error entry defined by the PLD address outputs of buffers 56-1 through 56-3 and the decoded zero count state of the 5-bit complementary count state at the output of the counter 42 will allow the one of lines $60_1$ through $60_n$ that has been programmed to respond to that error to be pulled up to a high level, thus setting output 54, i.e. error bit flag 54 to a high logic level. The single one of the lines $60_1$ through $60_n$ that has been pulled up a high level is fed to bad bit address data memory 36 where it acts as an asserted word line and thus selects a single data word programmed into the bad bit address data memory 36 to provide as outputs the m-bit column address to the bad bit column position decoder 38 causing the bit column address line (one of $44_0$ through $44_m$) of the column address of the bad bit to be activated and presenting N copies of the correct data to be presented to the corrected data determiner 48. As previously noted, multiple copies of the correct bit value may be stored to increase the reliability of the memory array 10 with error correction. In the event that one of the N storage locations of the replacement bit becomes defective, a voting scheme may be used to verify the correct value of the replacement bit in corrected data determiner 48, which, as previously mentioned, may be, for example, a voting circuit. Voting circuits are well known in the art. The corrected data value is presented on output line 50.

In addition, as indicated above, the data word programmed into the bad bit address data memory 36 for each identified error can also include ECC bits for the data word as well as the optional bit to drive the error bit flag 54.

As previously noted, the counter 42 allows multiple bad bits in a single data memory word to be corrected. Each bit error in a single data word that is read from memory is programmed as an individual error entry on a different one of lines $60_1$ through $60_n$ in the error PROM read decoder section 30. The first error found in a data word is programmed so that the counter state "0" in combination with the address on bus 20 activates a first one of lines $60_1$ through $60_n$ to provide the address for that error to the bad bit address data memory 36. In the case where a second bit error is found in the same data word in the memory, the error bit flag 54 will remain high after the next bit clock pulse on line 54 has clocked the counter 42 to counter state "1". That second error is programmed onto a different one of lines $60_1$ through $60_n$ in the error PROM read decoder section 30 so that the counter state "1" in combination with the address on bus 20 activates a second one of lines $60_1$ through $60_n$ to provide the address for that error to the bad bit address data memory 36. Additional bit errors are identified by using successive counter states of the counter 42 in combination with the address on bus 20 to activate additional ones of lines $60_1$ through $60_n$ to provide the addresses to the bad bit address data memory 36.

As an example of the operation of the error PROM 24, consider the case where a data word at data memory address XXXX is found to have a single bit error at bit position 3. The next available one of lines $60_1$ through $60_n$ in the error PROM read decoder section 30 is programmed to respond to an address including a partial address XXXX from the address bus 20 on lines 56-0 through 56-3 and a partial address provided by counter state "0" from counter 42 on lines 66. Because the counter 42 is reset to state "0" on line 64 each time a new address is asserted on the address bus 20, the programmed one of lines $60_1$ through $60_n$ in the error PROM read decoder section 30 will go to a high logic level and the error bit flag 54 will go to a high logic level. The programmed one of lines $60_1$ through $60_n$ in the error PROM read decoder section 30 is a decoded word line address to the bad address data memory 36 at which is stored the m-bit column address to the bad bit column position decoder 38 to provide the bit position of the bad bit on one of lines $44_0$ through $44_n$ and the N copies of the corrected bit value to be read out from bad address memory 360 and appear on the corrected data bit out line 50 from the corrected data determiner 48. Controller 18 will write the correct data bit from into sense amplifiers 16, as will be described further below, responsive to error bit flag 54. As noted, the data at the word line address in the bad address data memory 36 may also include ECC bits and a driving bit for the error bit flag 54.

Controller 18 then asserts a next bit clock pulse at line 52 in FIG. 2 to increment the counter 42. If there has been a second bad bit position programmed onto another one of the lines $60_1$ through $60_n$ in the error PROM read decoder section 30, a word line address on one of lines $60_1$ through $60_n$ decoded from the address bus 20 on lines 56-0 through 56-3 and counter state "1" from counter 42 on lines 66, will cause the one of the lines $60_1$ through $60_n$ in the error PROM read decoder section 30 programmed for that error to go to a high logic level and the error bit flag 54 will again go to a high logic level. It will also cause the bad address memory 36 to access the bad bit column position decoder 38 so as to provide the bit position of the second bad bit from the addressed word on a different one of lines $44_0$ through $44_n$ and will cause the N copies of the corrected bit value to be read out from bad address memory 36 and appear on the corrected data bit out line 50 from the corrected data determiner 48. Controller 18 will write the correct data bit from into sense amplifiers 16, as will be described further below, responsive to error bit flag 54.

Controller 18 then asserts a next bit clock pulse at line 52 in FIG. 2 to increment the counter 42 to counter state "2". The above-recited process will repeat until the address from the address bus 20 and the partial address from the counter 42 does not cause any of the lines $60_1$ through $60_n$ in the error PROM read decoder section 30 to go to a logic high level. In this state, the error bit flag 54 will be at a logic low level, indicating to the controller 18 that no additional bad bits in the addressed word have been identified and programmed into the error PROM read decoder section 30. In an embodiment where the counter is a 5-bit counter, this process may be performed to identify and correct up to 32 bad bits that have not simultaneously failed in a single addressed data word.

If line 60-X is active (represents an error entry) because ReRAM element 78 has been programmed, and the circuit shown in FIG. 3 and FIG. 4 is functioning properly, then one of the pair of ReRAM elements 86 and 92 and 100 and 106 will be in a programmed state and the other ReRAM element of the pair will be in an unprogrammed state. There are two failure modes for the error PROM read decoder section 30.

In a first failure mode one of the pair of ReRAM elements 86 and 92 and 100 and 106 that is supposed to remain unprogrammed is erroneously programmed, resulting in both ReRAM elements in the pair being in a programmed state, and in a second failure mode one of the pair of ReRAM elements 86 and 92 and 100 and 106 that is supposed to be programmed is erroneously erased or fails to program, resulting in both of the ReRAM elements being in the unprogrammed state.

In the first failure mode where both ReRAM elements in a pair are in a programmed state, the line 60-X will never be allowed to go high, and no bad bit will be replaced in the sense amplifiers. This will cause the ECC 14 associated with the data memory 12 to report the uncorrected bit error to the controller 18. The controller 18 will respond by causing the error PROM write section 34 to reprogram the bad bit substitution on another one of lines 60-1 through 60-5. This failure mode is thus self-correcting. The failed line 60-X disables itself since it can never be selected and the ECC 14 associated with the data memory 12 initiates a replacement error correction entry in the error PROM 24.

In the second failure mode where both ReRAM elements in a pair are in an unprogrammed state the error is not self-correcting. This is because the line 60-X can erroneously be allowed to go to a high state through the erroneously unprogrammed one of the ReRAMs. One way to detect this error is to provide XNOR gate 112 having its inputs connected to ReRAMs 86 and 92. The output of the XNOR gate 112 is ANDed with the state of the line 60-X in AND gate 114. If both ReRAMs 86 and 92 are in an unprogrammed state then the output of the XNOR gate 112 is high and the output of the AND gate 114 at reference numeral 116 communicating with the controller 18 is also high indicating an error PROM error of the second failure mode type.

Similarly, XNOR gate 118 has its inputs connected to ReRAMs 100 and 106. The output of the XNOR gate 118 is ANDed with the state of the line 60-X in AND gate 120. If both ReRAMs 100 and 106 are in an unprogrammed state then the output of the XNOR gate 118 is high and the output of the AND gate 120 at reference numeral 122 communicating with the controller 18 is also high indicating an error PROM error of the second failure mode type.

The controller 18 responds to second failure mode errors reported on lines 116 and 122 by instructing error PROM write section 34 to program the correction for the bad bit as an error entry onto another one of the lines 60-1 through 60-5, and further to erase ReRAM element 78 of the line 60-X exhibiting the error or to program an additional ReRAM element on the affected line 60-X to thereby disable it.

Persons of ordinary skill in the art will appreciate that there are other logic arrangements that will provide the same error detection function. Such skilled persons will also appreciate that there are other possible solutions. For example, a periodic read operation of the error PROM 24 may be performed when it is idle by cycling through the word lines driven by lines $60_1$ through $60_n$. The ECC 26 (or ECC bits stored in the bad bit address data memory 36) is used to detect a weak or defective ReRAM bit and the controller 18 may then either reprogram the weak bit or delete the PLD term by programming one or more additional ReRAM elements along the line 60-X to disable it and then program a substitute term as previously discussed.

Figure 5:
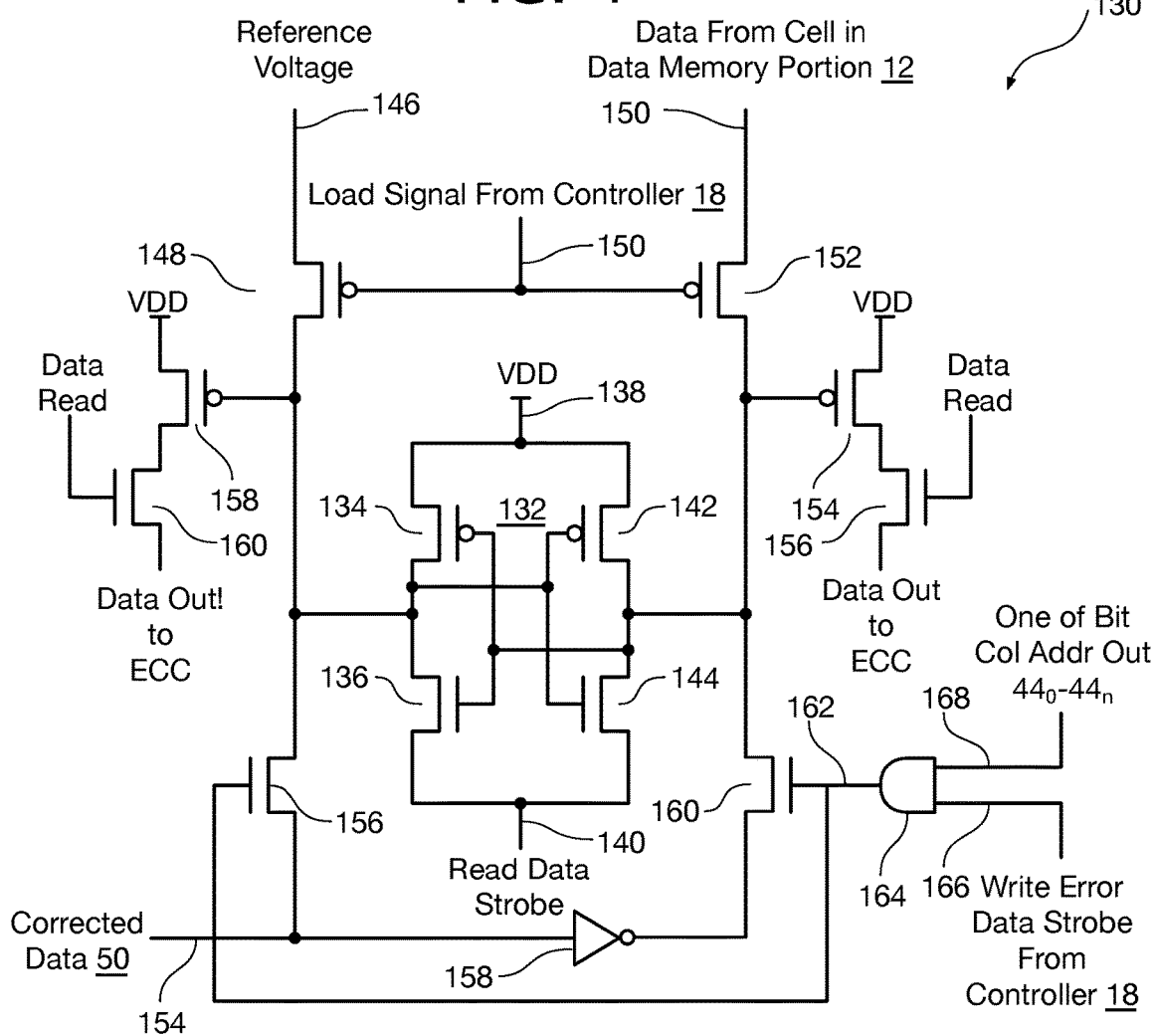
FIG. 5 is a schematic diagram of an illustrative data-correctable sense amplifier that may be used as a memory read circuit in a data PROM with error correction in accordance with an aspect of the present invention.

Referring now to FIG. 5, a schematic diagram of an illustrative data-correctable memory read circuit in the form of a sense amplifier 130 that may be used in a memory array 10 with error correction in accordance with an aspect of the present invention. Persons of ordinary skill in the art will appreciate that the data-correctable sense amplifier shown in FIG. 5 is but one non-limiting example of a memory read circuit that can be used with a memory array 10 with error correction in accordance with an aspect of the present invention.

The data-correctable sense amplifier 130 includes a bi-stable cross-coupled latch 132 formed from a first p-channel transistor 134 connected in series with a first n-channel transistor 136 between a voltage source 138 and a read data strobe line 140. A second p-channel transistor 142 is connected in series with a second n-channel transistor 144 between the voltage source 138 and the read data strobe line 140. The gates of the first p-channel transistor 134 and the first n-channel transistor 136 are connected together to the common drain connection of the second p-channel transistor 142 and the second re-channel transistor 144. The gates of the second p-channel transistor 142 and the second re-channel transistor 144 are connected together to the common drain connection of the first p-channel transistor 134 and the first n-channel transistor 136.

The common drain connection of the first p-channel transistor 134 and the first re-channel transistor 136 are connected to a reference voltage at reference numeral 146 through a p-channel transistor 148. The common drain connection of the second p-channel transistor 142 and the second n-channel transistor 144 are connected to the data output from the selected cell in the user memory portion 12 at reference numeral 150 through a p-channel transistor 152. The gates of the transistors 148 and 152 are connected together to a load signal 150 from the controller 18. Thus far, the portion of the data-correctable sense amplifier 130 is a conventional sense amplifier circuit and its operation is well known.

Corrected data on output line 50 from the corrected data determiner 48 is presented on line 154, and is coupled to the common drain connection of the first p-channel transistor 134 and the first n-channel transistor 136 through an n-channel transistor 156. An inverter 158 generates the complement of the corrected data which is coupled to the common drain connection of the second p-channel transistor 142 and the second n-channel transistor 144 through an n-channel transistor 160.

The gates of transistors 156 and 160 are driven together by a decoded write error strobe on line 162. The decoded write error signal on line 162 is generated in AND gate 164 from an error write signal generated from the controller 18 on line 166 and the one of Bit Column Address lines $44_0$ through $44_n$ that is activated by the bad bit column position decoder 38 to identify the column position of the bit error. The error write signal generated from the controller 18 on line 166 is generated by the controller 18 in response to the error bit flag 54 of FIG. 2 (the output of the OR gate 70 of FIG. 3).

Depending on the speed at which the error signals become available in any particular embodiment of the invention, the controller 18 may first write the defective data from the selected cell in the user memory portion 12 into the latch 130 by asserting an active low write (load) control signal on line 150 and then overwrite the defective data with the corrected data by asserting an active high write control signal on decoded write error data strobe line 162. In instances where a data word contains multiple errors, it is likely that the error correction of all bad bits will take some time and that an overwrite procedure will be used.

Figure 6:
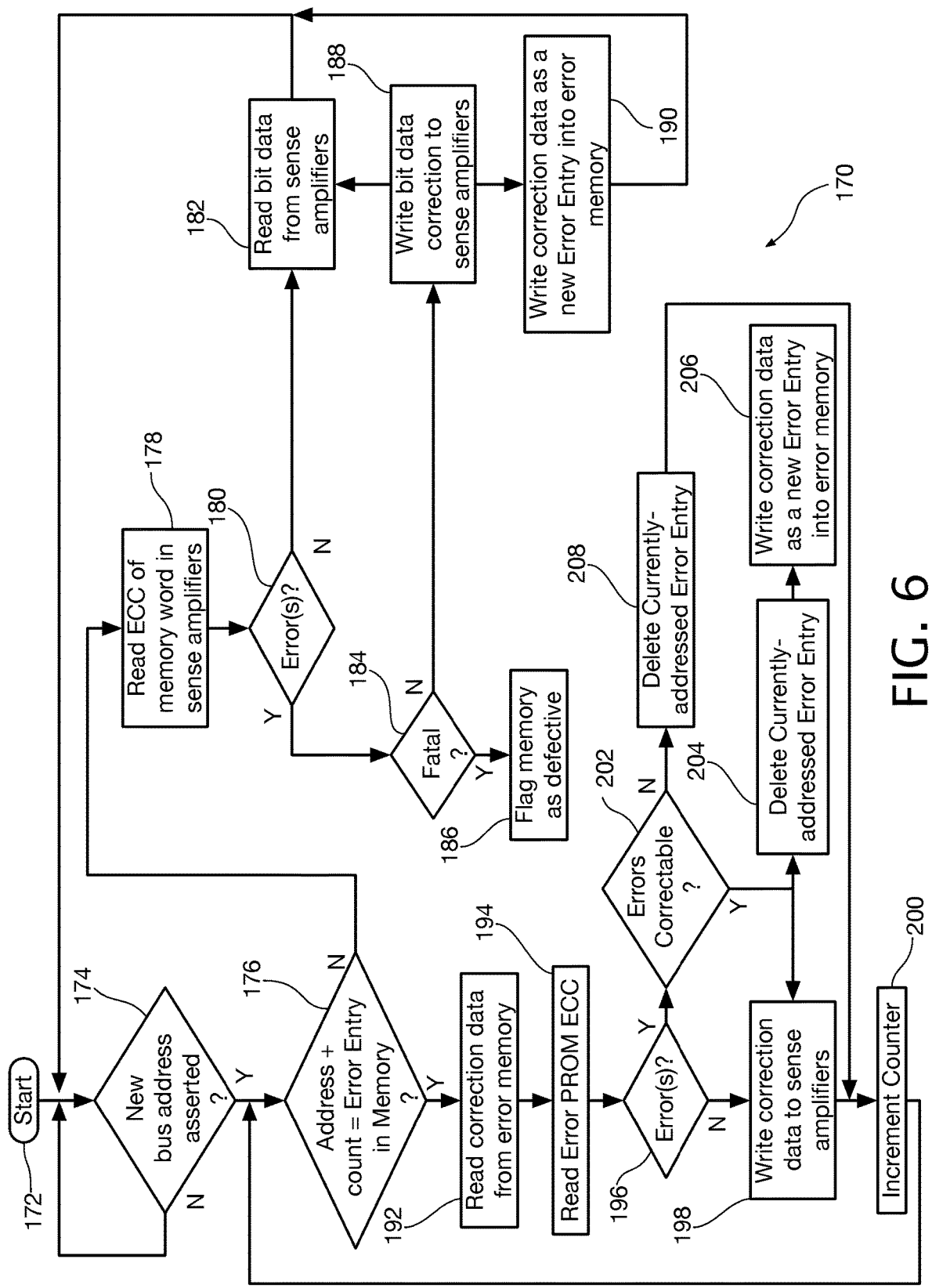
FIG. 6 is a flow diagram that illustrates an example of a method for performing error correction in a memory array in accordance with an aspect of the present invention.

Referring now to FIG. 6, a flow diagram illustrates an example of a method 170 for performing error correction in a memory array 10 in accordance with an aspect of the present invention. The method begins at reference numeral 172.

At reference numeral 174 it is determined whether a new address has been asserted on the memory address bus 20. If not, the method waits at reference numeral 174 until a new address has been asserted on the memory address bus 20.

At reference numeral 176, it is determined whether the asserted address on the bus 20 plus the current count of the counter 42 of FIG. 3 is decoded as an error entry on one of lines 60₁ through 60ₙ to address a word in the bad bit address data memory 36 of the corrected data out section 32 of the error correction PROM 24 of FIG. 2.

If the asserted address on the bus 20 plus the current count of the counter 42 of FIG. 3 is not decoded as an error entry that outputs a word stored in the bad bit address data memory 36 of the corrected data out section 32 of the error correction PROM 24 of FIG. 2, the method proceeds to reference numeral 178 where ECC is performed in ECC 14 of FIG. 1 on the data that has been loaded into the sense amplifiers.

At reference numeral 180, it is determined whether the ECC 14 has sensed any errors in the data that has been loaded into the sense amplifiers. If no errors have been sensed in the data that has been loaded into the sense amplifiers the method proceeds to reference numeral 182 where the bit data is read from the sense amplifiers. The method then returns to loop through reference numeral 174 until a new address has been asserted on the address bus 20.

If at reference numeral 180, it has been determined that the ECC 14 has sensed any errors in the data that has been loaded into the sense amplifiers, the method proceeds to reference numeral 184 where it is determined whether the error is fatal. The most-common error correcting codes, such as a single-error correction and double-error detection (SECDED) Hamming code, allow a single-bit error to be corrected and (in the usual configuration, with an extra parity bit) double-bit errors to be detected. As will be appreciated by persons of ordinary skill in the art, if multiple bit errors are simultaneously detected in a word read from memory, and the number of bit errors simultaneously detected exceeds the capability of the ECC to correct all of them, the bit values cannot be corrected. More complex ECC schemes allow more than one simultaneous bit error to be corrected but at the cost of larger ECC memory sizes. When the number of simultaneous bit errors exceeds the capability of the ECC to correct all of the defective bits, the error is fatal and the method proceeds to reference numeral 186, where the memory array 10 is flagged as defective.

If at reference numeral 184 it has been determined that the error is not fatal, the method proceeds to reference numeral 188 where the bit correction data supplied by the ECC 14 is written to the identified bit position in the sense amplifiers and then to both reference numeral 182 where the data is read from the sense amplifiers and to 190, where the address, bit position and corrected bit data for the addressed memory word are written as a new error entry into the bad bit address data memory 36 in the error PROM 24. As indicated above this comprises programming one of the lines 60₁ through 60ₙ in the error PROM read decoder section 30 with the address asserted in reference numeral 174, as well as an error count (the count state of the counter 42) for this address, as a pointer to the address in bad bit address data memory 36 where the bit position and corrected bit data are stored.

The bit correction data supplied by the ECC 14 is preferably written to the identified bit position in the sense amplifiers at reference numeral 188 before the address, bit position and corrected bit data for the addressed memory word are written as a new error entry into the bad bit address data memory 36 in the error PROM 24 at reference numeral 190 in order to minimize the wait time for the bit data to be read from the sense amplifiers. The reading of the bit data from the sense amplifiers at reference numeral 182 can take place at the same time that the address, bit position and corrected bit data for the addressed memory word are written as a new error entry into the bad bit address data memory 36 in the error PROM 24 at reference numeral 190 to minimize the read out delay from the data memory 12. The method then returns to wait at reference numeral 174 until a new address has been asserted on the address bus 20.

If it is determined at reference numeral 176 that the asserted address on the bus 20 plus the current count of the counter 42 of FIG. 3 are decoded as an error entry that outputs a word stored in the bad bit address data memory 36 of the corrected data out section 32 of the error correction PROM 24 of FIG. 2, the method proceeds to reference numeral 192, where the correction data associated with the error entry stored in the bad bit address data memory 36 of FIG. 2 (including the m-bit output on lines 40 that identifies the column location of the particular bit having the erroneous bit value and the N copies of the correct data) is read from the bad bit address data memory 36.

At reference numeral 194, ECC is performed in ECC 26 of FIG. 1 on the correction data that has been read from the bad bit address data memory 36. At reference numeral 196, it is determined whether the ECC 26 in combination with ECC bits stored as part of the data word in the bad bit address memory 36 has sensed any errors in the correction data that has been read from the bad bit address data memory 36.

If no errors have been sensed in the correction data that has been read from the bad bit address data memory 36 the method proceeds to reference numeral 198 where the bit correction data that has been read from the bad bit address data memory 36 is written into the column sense amplifier specified by the correction data read from the bad bit address data memory 36. The method then proceeds to reference numeral 200 where the counter is incremented. The method then returns to reference numeral 176 and repeats the previously-described sequence until the counter increments to a count that together with the asserted address on bus 20 do not form an error entry, as described in relation to reference numeral 176.

If at reference numeral 196, it has been determined that the ECC 26 has sensed any errors in the correction data that has been read from the bad bit address data memory 36, the method proceeds to reference numeral 202 where it is determined whether the errors are correctable. As previously noted, the number of simultaneous errors that can be corrected will depend on how the ECC 26 is configured. If the ECC 26 can correct the errors, the method proceeds to reference numeral 198 where the ECC-corrected bit correction data that has been read from the bad bit address data memory 36 is written into the column sense amplifier specified by the correction data read from the bad bit address data memory 36 as previously described. At reference numeral 204, the currently-addressed error entry in the error PROM read decoder section 30 that produced the ECC error is deleted and at reference numeral 206 a new error entry is written into the next available address in the error memory and the corrected data from the ECC 26 is written into the bad bit address data memory 36 at a location associated with the new error entry as previously described.

If at reference numeral 202 it is determined that the errors are not correctable, the method proceeds to reference numeral 208, where the currently-addressed error entry in the error PROM read decoder section 30 that produced the ECC error is deleted. The method then proceeds to reference numeral 200 where the counter is incremented and from there again to reference numeral 176 to determine if the data word addressed in the data memory has any additional associated error entries.

Persons of ordinary skill in the art will appreciate that the uncorrectable errors found at reference numeral 202 will not be replaced in the sense amplifiers and, when the data word, including any other bits that have been replaced, is examined by the ECC 14 in the data memory 12, there will be another opportunity to correct the bit error that had bad correction data read from the error memory as described in relation to reference numerals 178-190.

In accordance with an aspect of the invention, the read time for data in the data memory 12 can be shortened by including a next failure flag bit at each error entry in the bad bit address memory 36. If the current error entry being accessed by the bad bit address data memory 36 of FIG. 2 does not represent the last defective bit to be corrected in the currently-addressed data memory word read from the data memory 12, the next failure flag bit is set at that error entry in the bad bit address data memory. The controller monitors the next failure flag bit and asserts a next bit clock pulse on line 52 of the error PROM read decoder section to advance the counter state only if that bit has been set. Providing a next failure flag bit avoids unnecessarily clocking the counter 42 past the last count state at which a bad bit will be found.

Figure 7:
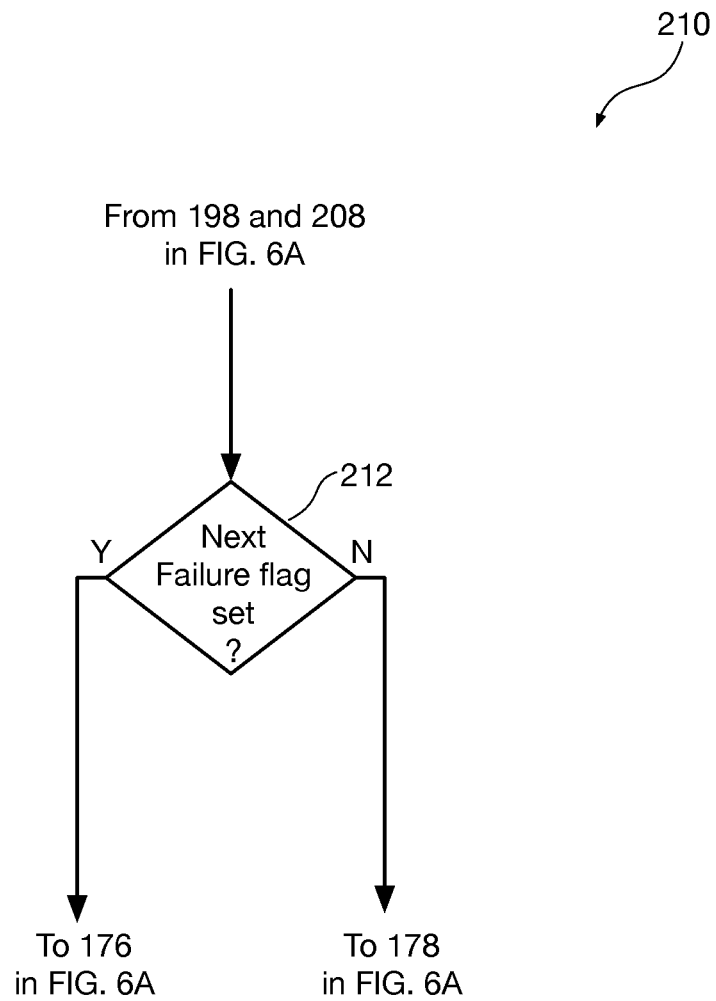
FIG. 7 is a flow diagram that illustrates another example of a method for performing error correction in a memory array in accordance with an aspect of the present invention that is a variation of the method shown in FIG. 6.

Referring now to FIG. 7, a flow diagram illustrates a method 210 that is performed during the method 170 of FIG. 6 that employs the concept of the next bad bit flag to avoid unnecessary incrementing of the counter 42. FIG. 7 shows substitute steps that are performed in place of incrementing the counter 42 at reference numeral 200 of FIG. 6. After either writing correction data to the sense amplifiers at reference numeral 198 or deleting a currently-addressed error entry at reference numeral 208 of FIG. 6, the method of FIG. 7 proceeds to reference numeral 212 where it is determined whether the next failure flag in the currently-addressed error entry has been set.

If the next failure flag in the currently-addressed error entry has been set, the method returns to reference numeral 200 of the method 170 in FIG. 6 where the counter is incremented. If the next failure flag in the currently-addressed error entry has not been set, the method returns to reference numeral 178 of the method 170 in FIG. 6 where ECC is performed in ECC 14 of FIG. 1 on the data that has been loaded into the sense amplifiers. Persons of ordinary skill in the art will observe that if the method 210 of FIG. 7 is entered after deleting a currently-addressed error entry at reference numeral 208 in the method 170 of FIG. 6, the reading of correction data from the error memory at reference numeral 192 of FIG. 6 will include reading the status of the next failure flag, so the next failure flag information will not have been lost by deleting the currently-addressed error entry at reference numeral 208 in the method 170 of FIG. 6.

When a first error entry is created for a bad bit in any addressed data word from the data memory 12, the next failure flag bit in that error entry is in a reset state, i.e. it is not set. The next failure flag bit is set when an additional bad bit is later detected in the same addressed data word and an error entry is created for that later error.

Referring again to FIG. 2, a next failure flag bit output of the bad bit address data memory 36 is shown at reference numeral 240. The next failure flag bit output 240 of the bad bit address data memory 36 communicates with the controller 18. A set value shown at reference numeral 242 for that next failure flag bit output 240 is presented to the bad bit address data memory 36 on line 244.

A write enable pulse 250 to program the set value 242 can be supplied to the bad bit address data memory 36 in several ways. In accordance with an aspect of the invention, a binary encoder 246 in the error PROM write section 34 provides the binary address that has been mask programmed to the current one of lines $60_1$ through $60_n$ to the controller 18 on lines 248. The binary encoder 246 converts an active input on one of lines $60_1$ to $60_n$ to a binary address in the range $2^{(n-1)}$ and thus performs the inverse function of the address decoder portion of the binary decoder and write circuitry 62. The controller 18 provides a write enable command to the bad bit address data memory 36 on line 250 to cause the error PROM write section 34 to set the next failure flag bit in the bad bit address data memory word line identified by binary encoder 246. An example of a method for performing this action is shown with reference to FIG. 8.

In accordance with an aspect of the invention, a bad bit address data memory write circuitry 252 in the error PROM read decoder section 30 can respond to a command from the controller 18 on line 254 to output a write enable command to the bad bit address data memory 36 on line 256. An example of a method for performing this action is shown with reference to FIG. 8.

At the time an additional error is corrected in a memory word, the controller 18 sets the next bit failure flag into the last-entered error entry for the memory word in the bad bit address data memory 36 when writing the new failure data in that given data word. Since the controller 18 does not know the binary address of the previous error entry for the addressed data word used by the error PROM write section 34, for every new error it must search the entire error PROM 24 looking for the PLD address having the same data bus 20 address as a first partial address and the highest count state of counter 42 as a second partial address as the current error. This process can therefore add overhead time to writing failed bits in the error PROM 24.

This overhead can be eliminated by causing the controller 18 to set the next bad bit flag in the current word in the bad bit address data memory 36. This can be done in two ways.

In accordance with one method that will be described with reference to FIG. 8, by adding some additional logic to the error PROM write section 34 (e.g., the binary encoder 246 having as inputs lines $60_1$ through $60_n$), the address of the entry in the error PROM write section 34 that activated the one of lines $60_1$ through $60_n$ can be read from the binary encoder 248 in the error PROM write section 34. The controller 18 then uses that address in the error PROM write section 34 to write the next bad bit flag. In the illustrative embodiments described herein, the writing process is used to program selected ones of the ReRAM elements in bad bit address data memory 36. As previously noted, the controller 18 may employ conventional ReRAM programming techniques to control programming circuitry in the error PROM write section 34, details of which are unnecessary for an understanding of the present invention.

In accordance with another method that will be described with reference to FIG. 9, once the final previously-programmed error entry for the data word error entry (whose next failure flag has not been set) has been located, the controller 18 enables the bad bit address data memory write circuitry 252 in the error PROM read decoder section 30 to set the next failure flag in the bad bit address decoder memory 36 for that final previously-programmed error entry. This method requires fewer steps than the method described with reference to FIG. 8.

Referring now to FIG. 8, a flow diagram illustrates an example of a method 260 for setting a next failure flag in a location in a bad bit address data memory of an error PROM and writing correction bit data to the error PROM in accordance with an aspect of the invention. The method begins at reference numeral 262 in response to the controller 18 receiving an ECC error from the ECC 14 monitoring the output of the data memory 12. The method proceeds to reference numeral 264 where it is determined if the data word accessed from the data memory has a previously-programmed data error. This is determined by examining the error bit flag 54 shown in both FIG. 2 and FIG. 3. If the error bit is not set, there is no previously-programmed error associated with the data word and no need to set a next failure flag. The method ends at reference numeral 266. If the data word accessed from the data memory has a previously-programmed data error, the method proceeds to reference numeral 268 where the controller 18 directs the error PROM write section 34 to the binary address provided by the binary encoder 246. The binary encoder 246 provides a convenient way to translate the identity of the currently-addressed one of the word lines $60_1$ through $60_n$ to the binary address used by the error PROM write section 34 to address it when writing to it since binary encoder 246 outputs the binary address associated with the currently active word line containing the error entry. At reference numeral 270, the error PROM write section 34, particularly binary decoder and write circuitry 62, sets the next failure flag bit in the bad bit address data memory 36 at the location containing the correction data for last-entered error entry for the data word with the new bit failure.

At reference numeral 272, the controller 18 searches entries in the error PROM read decoder section 30 to locate the next word line address having no data and which is available for a new error entry. This is easily accomplished by the controller 18 using, e.g., a bubble search technique known in the art that can find the next available address in an N bit address word in N operations by setting first the most significant address bit (MSB), testing the error bit flag line 54 of FIG. 2 or FIG. 3 and repeating the test by setting successively lower significant address bits. This process is very efficient and takes less time than a memory write cycle to find the next unused binary address. At reference numeral 274, the error PROM write section 34 writes the address, bit position and corrected bit data for the addressed memory word as a new error entry into error memory at the located word line address. The method ends at reference numeral 266.

Referring now to FIG. 9, a flow diagram illustrates another example of a method 280 for setting a next failure flag in a location in a bad bit address data memory of an error PROM 24 and writing correction data to the error PROM 24 in accordance with an aspect of the invention. The method begins at reference numeral 282 in response to the controller 18 receiving an ECC error from the ECC 14 monitoring the output of the data memory 12.

The method proceeds to reference numeral 284 where it is determined if the data word accessed from the data memory has a previously-programmed data error. This is determined by examining the error bit flag 54 shown in both FIG. 2 and FIG. 3. If the error bit is not set, there is no previously-programmed error associated with the data word and no need to set a next failure flag. The method ends at reference numeral 286. If the data word accessed from the data memory has a previously-programmed data error, the method proceeds to reference numeral 288 where the error PROM read decoder section 30 sets the next failure flag bit in the bad bit address data memory, utilizing bad bit address data memory write circuitry 252, at the current location containing the correction data for the last error entry associated with the current address bus address.

At reference numeral 290, the entries in in the error PROM read decoder section 30 are searched to locate the next word line address having no data and which is available for a new error entry. This searching may be done in the same manner as the searching performed at reference numeral 272 in FIG. 8. At reference numeral 292, the error PROM write section 34 writes the address, bit position and corrected bit data for the addressed memory word as a new error entry into error memory at the located word line address. The method ends at reference numeral 286.

When the data memory portion 12 of the memory array 10 is in use, it is sometimes necessary to write new data into one or more addresses. According to an aspect of the invention, the data that is newly written into bit positions in memory address locations that have previously exhibited data errors will also need to be corrected. FIG. 10A and FIG. 10B are flow diagrams showing illustrative methods for writing new data into memory address locations to assure that correction data is provided for one or more bad bit positions that may exist at the memory address location. The difference between the methods shown in FIG. 10A and FIG. 10B is that the method shown in FIG. 10A does not employ the next bad bit flag concept and the method shown in FIG. 10B does employ the next bad bit flag.

Referring now to FIG. 10A, the method 300 starts at reference numeral 302. At reference numeral 304 a data memory write request is received by the controller 18. The controller asserts a write address on the memory bus 20 at reference numeral 306.

At reference numeral 308 the data is written into the memory portion 12 at the specified address. At reference numeral 310 it is determined whether the error bit flag 54 has been set. FIG. 10A shows this operation occurring simultaneously with the writing of the data at reference numeral 308 in order to improve the speed of the procedure.

If it is determined at reference numeral 310 that the error bit flag has not been set, the method ends at reference numeral 312. If it is determined at reference numeral 310 that the error bit flag has been set, the method proceeds to reference numeral 314 where N copies of the correct bit data for the bit position identified by the error entry in the bad bit address memory 36 are written into the bad bit address memory 36 by the bad bit address data memory write circuitry 252.

The method then proceeds to reference numeral 316 where the counter is incremented. Next, at reference numeral 318, it is determined whether the error bit flag 54 has been set. If it is determined at reference numeral 318 that the error bit flag has not been set, the method ends at reference numeral 312. If it is determined at reference numeral 318 that the error bit flag has been set, the method returns to reference numeral 314.

Referring now to FIG. 10B, the method 320 starts at reference numeral 322. At reference numeral 324 a data memory write request is received by the controller 18. The controller asserts a write address on the memory bus 20 at reference numeral 326.

At reference numeral 328 the data is written into the memory portion 12 at the specified address. At reference numeral 330 it is determined whether the error bit flag 54 has been set. FIG. 10B shows this operation occurring simultaneously with the writing of the data at reference numeral 328 in order to maximize the speed of the procedure.

If it is determined at reference numeral 330 that the error bit flag has not been set, the method ends at reference numeral 332. If it is determined at reference numeral 330 that the error bit flag has been set, the method proceeds to reference numeral 334 where N copies of the correct bit data for the bit position identified by the error entry in the bad bit address memory 36 are written into the bad bit address memory 36 by the bad bit address data memory write circuitry 252.

The method then proceeds to reference numeral 336 where it is determined whether the next bit error flag at this location has been set. If the next bit error flag at this location has not been set the method ends at reference numeral 332. If the next bit error flag at this location has been set the method proceeds to reference numeral 338 where the counter is incremented. The method then returns to reference numeral 334.

Persons of ordinary skill in the art will appreciate that, while the present invention has been described with reference to embodiments employing ReRAM memory technology, the present invention can be practice with memories using non-volatile memory technologies other than ReRAM technology.

Figure 11A:
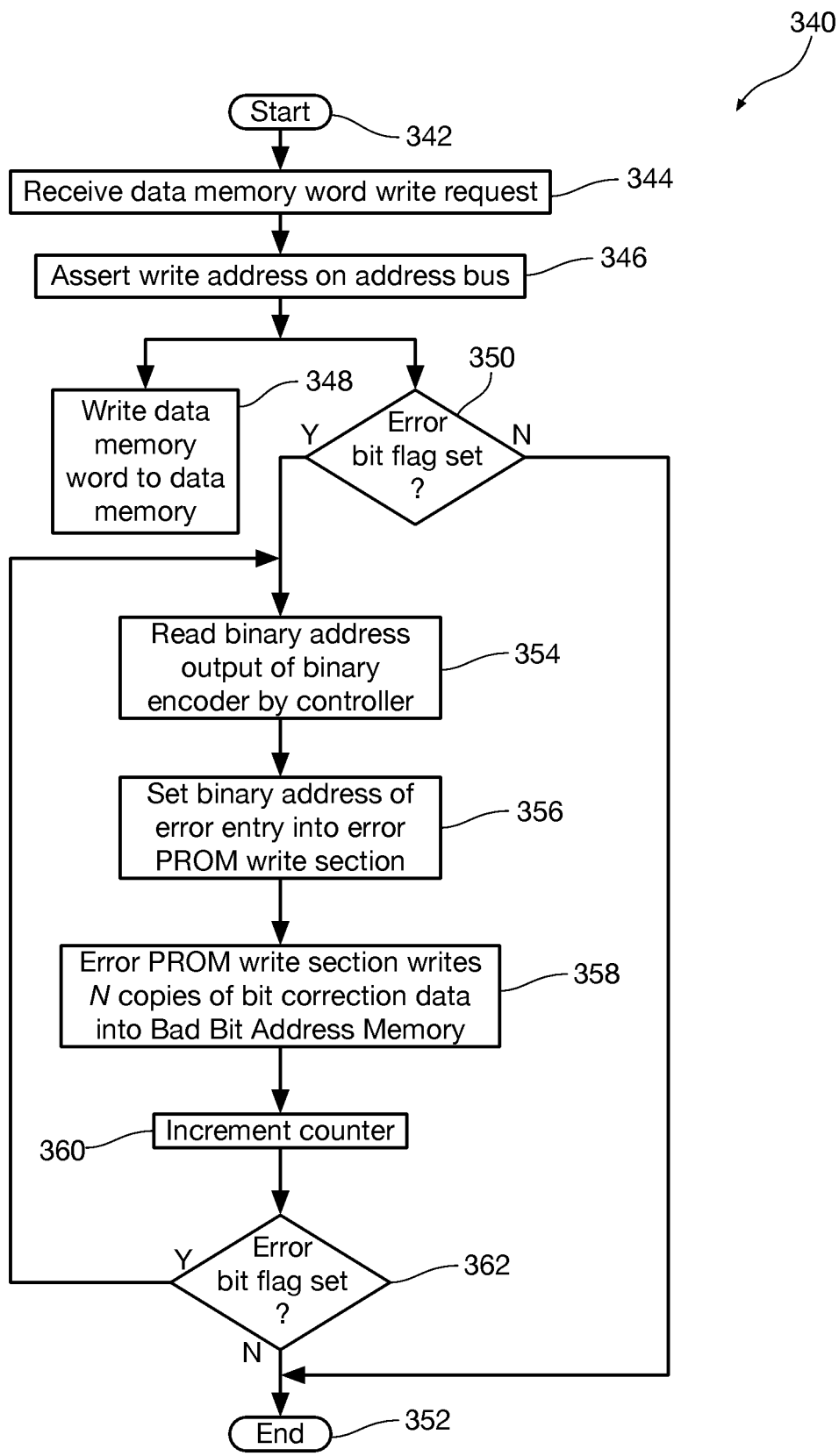
Figure 11B:
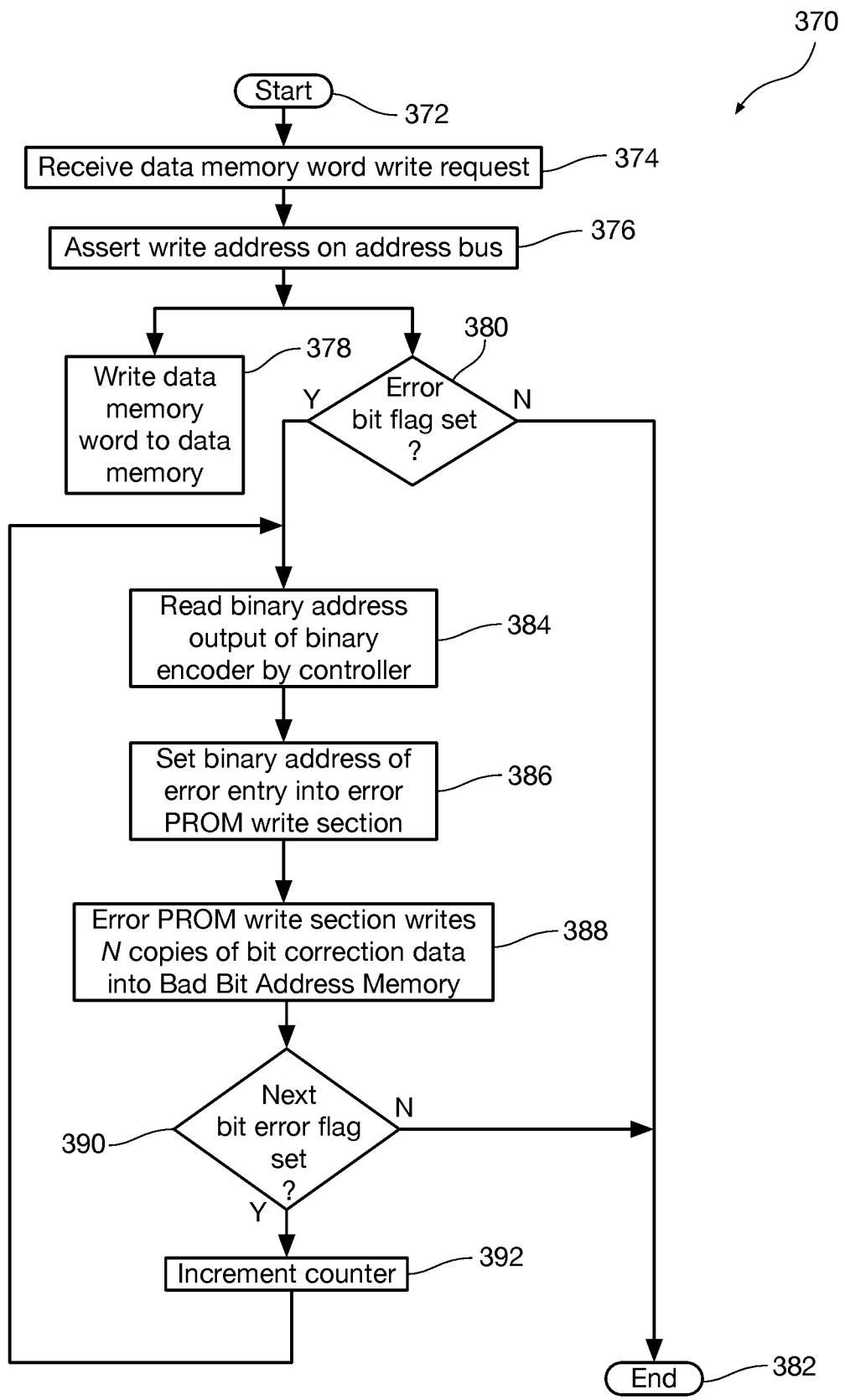

Referring now to FIG. 11A and FIG. 11B, flow diagrams show further illustrative methods for writing new data to a selected memory address in the memory portion 12 of memory array 10 in accordance with an aspect of the invention. The methods illustrated in FIG. 11A and FIG. 11B can be used when the error PROM read decoder section 30 of the error PROM 24 does not include the bad bit address data memory write circuitry 252 that allows directly writing to the bad bit address data memory 36 from the error PROM read decoder section 30.

FIG. 11A shows a method 340 for writing new data into a selected memory address in the memory portion 12 of memory array 10 in accordance with an aspect of the invention. The method starts at reference numeral 342.

At reference numeral 344 a data memory write request is received by the controller 18. The controller asserts a write address on the memory bus 20 at reference numeral 346.

At reference numeral 348 the data is written into the memory portion 12 at the specified address. At reference numeral 350 it is determined whether the error bit flag 54 has been set. FIG. 11A shows this operation occurring simultaneously with the writing of the data at reference numeral 348 in order to improve the speed of the procedure.

If it is determined at reference numeral 350 that the error bit flag has not been set, the method ends at reference numeral 352. If it is determined at reference numeral 370 that the error bit flag has been set, the method proceeds to reference numeral 354 where the controller reads the binary address pointing to the error entry for the bit error, which binary address may be encoded and provided to the controller 18 by binary encoder 246. The method then proceeds to reference numeral 356 where the binary address is asserted to the error PROM write section 34.

The method then proceeds to reference numeral 358, where N copies of the correct bit data for the bit position identified by the error entry in the bad bit address memory 36 are written into the bad bit address memory 36 by the error PROM read section 34, particularly by binary decoder and write circuitry 62.

The method then proceeds to reference numeral 360, where the counter is incremented. Next, at reference numeral 362 it is determined whether the error bit flag 54 is set. If the error bit flag is not set, the method ends at reference numeral 352. If the error bit flag is set, the method returns to reference numeral 354.

FIG. 11B shows another method 370 for writing new data into a selected memory address in the memory portion 12 of memory array 10 in accordance with an aspect of the invention. The method starts at reference numeral 372.

At reference numeral 374 a data memory write request is received by the controller 18. The controller asserts a write address on the memory bus 20 at reference numeral 376.

At reference numeral 378 the data is written into the data portion 12 at the specified address. At reference numeral 380 it is determined whether the error bit flag 54 has been set. FIG. 11A shows this operation occurring simultaneously with the writing of the data at reference numeral 378 in order to improve the speed of the procedure.

If it is determined at reference numeral 380 that the error bit flag has not been set, the method ends at reference numeral 382. If it is determined at reference numeral 380 that the error bit flag has been set, the method proceeds to reference numeral 384 where the controller 18 reads the binary address pointing to the error entry for the bit error. As indicated above, the binary address may be encoded and provided to the controller 18 by binary encoder 246. The method then proceeds to reference numeral 386 where the binary address is asserted to the error PROM write section 34, preferably through binary decoder and write circuitry 62.

The method then proceeds to reference numeral 388, where N copies of the correct bit data for the bit position identified by the error entry in the bad bit address memory 36 are written into the bad bit address memory 36 by the error PROM write section 34, particularly by binary decoder and write circuitry 62.

The method then proceeds to reference numeral 390, where it is determined if the next bit error flag in the bad bit address data memory has been set. If the next bit error flag in the bad bit address data memory has not been set, the method ends at reference numeral 382. If the next bit error flag in the bad bit address data memory has been set, the method proceeds to reference numeral 392, where the counter is incremented. The method then returns to reference numeral 384.

Persons of ordinary skill in the art will appreciate that, while the present invention has been disclosed using embodiments that employ ReRAM elements as the nonvolatile storage elements, it is intended that embodiments that employ nonvolatile storage elements other than ReRAM elements are intended to fall within the scope of the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for providing error correction for a memory array comprising:
    for each data word stored in a data memory portion of the memory array having at least one bit error, storing in an error programmable read only memory (PROM) an error entry associated with an address of the data word in the data memory portion and including error data identifying a bit position of each bit error, and correct bit data for each bit error, the storing including programming a unique term into a programmable logic device that is a Boolean combination of the address of the data word in the data memory portion and a number of the bit error;

monitoring memory addresses presented to the data memory portion;

if a memory address presented to the data memory portion is associated with a respective error entry in the error PROM, reading from the error PROM the bit position of each bit error and the correct bit data for each bit error; and substituting the correct bit data into each identified bit position of a memory read circuit arranged to read data from the data memory portion.

2. The method of claim 1 wherein the number of the bit error is defined by an output state of a counter which forms a portion of the unique term that is the Boolean combination.

3. The method of claim 2 wherein:

each bit error in the data word is accessed in sequence by incrementing the counter to provide a different unique term; and the counter is incremented until the unique term that is a Boolean combination of the memory address of the data word and the output state of the counter does not define a respective error entry.

4. The method of claim 2 wherein each error entry in the error PROM includes a next failure flag bit;

the next failure flag bit for the most recently stored error entry for the memory address is in a first state and the next failure flag bit for all other stored error entries for the memory address is in a second state opposite the first state; and responsive to the next failure flag bit, the counter does not further increment when its output state is associated with a unique term defining the most recently stored error entry for the memory address.

5. The method of claim 2 wherein:

reading from the error PROM the bit position of each bit error comprises reading the bit position of each bit error from a memory in the error PROM; and reading from the memory in the error PROM the correct bit data for each bit error comprises reading the correct bit data for each bit error from the memory in the error PROM.

6. The method of claim 5 wherein reading from the error PROM the correct bit data for each bit error comprises:

reading multiple copies of the correct bit data for each bit error from the memory in the error PROM; and determining a correct data value from the read multiple copies of the correct bit data.

7. A method for providing error correction for a memory array comprising:

supplying to the memory array a memory address identifying a data word to be read from the memory array;

simultaneously supplying the memory address to an error programmable read only memory (PROM) containing error entries representing memory addresses identifying a data word of the memory array having defective data in at least one bit position and not containing entries for data words of the memory array not having defective data in at least one bit position;

if the memory address supplied to the error PROM identifies the respective data word having defective data in the at least one bit position, outputting from the error PROM corrected data comprising N copies of the corrected data, selecting from the N copies of the corrected data a single corrected data bit and outputting information identifying the bit position of the defective data in the data word;

reading the data word from the memory array into a memory read circuit; and substituting the single corrected data bit into the identified bit position of the memory read circuit.

8. A memory array with error correction comprising:

a data memory portion containing memory data words;

a sense amplifier section coupled to the data memory portion;

an address bus coupled to the data memory portion;

an error PROM coupled to the address bus;

a data memory portion error correction code (ECC) section operatively coupled to the data memory portion;

an error PROM ECC section operatively coupled to the error PROM;

a controller coupled to the address bus, the controller configured to:

assert an address on the address bus to read a data word from the data memory portion into the sense amplifier section;

write an error entry into the error PROM in response to a signal from the data memory portion memory error correction code (ECC) section, the error entry identifying a data word stored in the data memory portion having at least one data bit error, the bit position in the word of the data bit error, and a corrected data value for the data bit error; and respond to a signal from the error PROM ECC section identifying a data error entry stored in the error PROM memory having at least one error, the response including writing a corrected PROM data error entry into the error PROM memory at a different error PROM address and disabling the identified error entry stored in the error PROM memory;

wherein the error PROM is responsive to addresses asserted on the address bus having at least one error entry to read the correct data value for the data bit error and generate a correction signal to the sense amplifier section to substitute the read correct data value for the data bit error at the identified bit position in the data word at the address having error entries.

9. The memory array of claim 8 wherein the error PROM comprises an error PROM read decoder section, and wherein disabling the identified data memory portion error entry stored in the error PROM memory comprises programming an additional bit in the error PROM read decoder section.

10. The memory array with error correction of claim 8 wherein the substitution of the read correct data value for the data bit error at the identified bit position in the data word comprises overwriting defective data initially written into the sense amplifier at the identified bit position in the data word.

11. The memory array with error correction of claim 8 wherein the substitution of the read correct data value for the data bit error at the identified bit position in the data word comprises substituting the read correct data for defective data read from the data memory portion.

12. A memory array with error correction comprising:

a data memory portion containing memory data words;

a sense amplifier section coupled to the data memory portion;

an address bus coupled to the data memory portion;

an error PROM coupled to the address bus;

a data memory portion error correction code (ECC) section operatively coupled to the data memory portion;

a controller coupled to the address bus, the controller configured to:

assert an address on the address bus to read a data word from the data memory portion into the sense amplifier section;

write an error entry into the error PROM in response to a signal from the data memory portion ECC section, the error entry identifying a data word stored in the data memory portion having at least one data bit error, the bit position in the word of the data bit error, and a corrected data value for the data bit error;

increment a counter to locate multiple error entries for multiple bit errors in a single data word stored in the data memory portion; and wherein the error PROM is responsive to addresses asserted on the address bus having at least one error entry to read the correct data value for the data bit error and generate a correction signal to the sense amplifier section to substitute the read correct data value for the data bit error at the identified bit position in the data word at the address having error entries.

13. The memory array with error correction of claim 12 wherein the controller is further configured to stop incrementing the counter when the counter is incremented to a count state that does not locate an error entry in the error PROM.

14. The memory array with error correction of claim 12 wherein the controller is further configured to stop incrementing the counter when the counter reaches a state that locates the last entered error entry for the data word in the error PROM.

* * * * *